(12) United States Patent
Tao et al.

(10) Patent No.: US 9,793,203 B2
(45) Date of Patent: Oct. 17, 2017

(54) ISOLATION DEVICE

(71) Applicant: Avago Technologies General IP (Singapore) Pte. Ltd., Singapore (SG)

(72) Inventors: Qian Tao, Singapore (SG); Richard Lum Kok Keong, Singapore (SG); Boon Keat Tan, Singapore (SG)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 0 days.

(21) Appl. No.: 14/873,211

(22) Filed: Oct. 2, 2015

(65) Prior Publication Data

US 2017/0098603 A1 Apr. 6, 2017

(51) Int. Cl.
*H01L 23/522* (2006.01)
*H01L 23/31* (2006.01)
*H01L 29/06* (2006.01)

(52) U.S. Cl.
CPC ...... *H01L 23/5223* (2013.01); *H01L 23/3171* (2013.01); *H01L 29/0649* (2013.01)

(58) Field of Classification Search
None
See application file for complete search history.

(56) References Cited

U.S. PATENT DOCUMENTS

| 6,492,716 | B1 | 12/2002 | Bothra |
| 7,750,413 | B2 | 7/2010 | Hayashi et al. |
| 8,222,065 | B1 | 7/2012 | Smeys et al. |
| 8,592,944 | B2 | 11/2013 | Santangelo et al. |
| 8,853,816 | B2 | 10/2014 | Steeneken et al. |
| 2003/0020173 | A1* | 1/2003 | Huff ............ B81B 7/0064 257/774 |
| 2005/0179077 | A1 | 8/2005 | Schnitt |
| 2005/0275106 | A1 | 12/2005 | Fricke et al. |
| 2009/0160029 | A1 | 6/2009 | Pitts |
| 2014/0145297 | A1* | 5/2014 | Daamen ............ H01L 28/40 257/507 |
| 2015/0115407 | A1 | 4/2015 | Tao et al. |

FOREIGN PATENT DOCUMENTS

WO   WO 2012/065229   5/2012

* cited by examiner

*Primary Examiner* — Michelle Mandala
(74) *Attorney, Agent, or Firm* — Sheridan Ross P.C.

(57) ABSTRACT

An isolation device for isolating a first signal of a first circuit from a second circuit disclosed. The isolation device may have a substrate and a plurality of metal layers disposed on the substrate. The isolation device comprises a first plate that is electrically coupled to the first circuit, and a second plate that is electrically coupled to the second circuit. The first plate is configured to transmit the first signal from to a second plate that is electrically isolated from the first plate. The first plate and the second plate is surrounded by an isolation material. The isolation device further comprises at least one trench that extend at least partially through the isolation material in a direction that is substantially perpendicular to the first plate and the second plate. The at least one trench may circumscribe one of the first plate and the second plate.

34 Claims, 18 Drawing Sheets

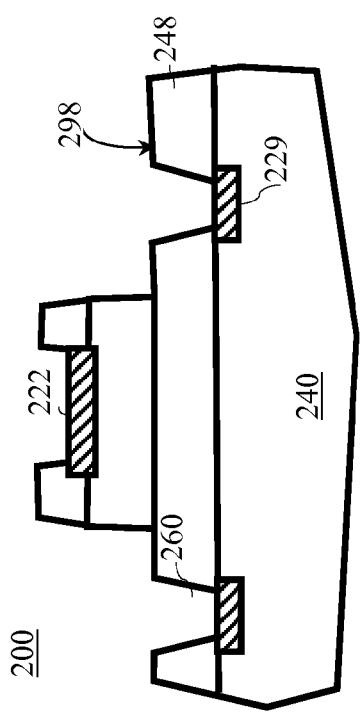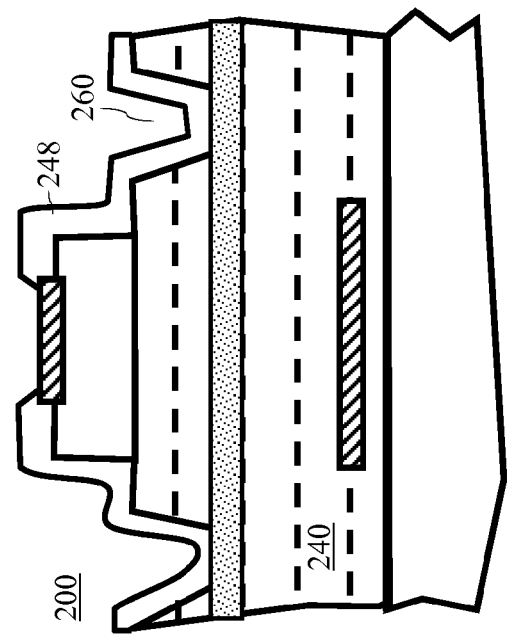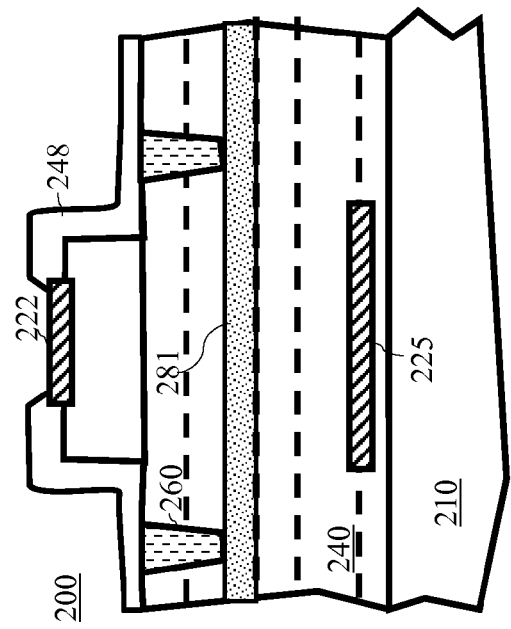

ISOLATION DEVICE

BACKGROUND

A galvanic isolator provides a way for transmitting a signal from one electrical circuit to another electrical circuit in a control system when the two electrical circuits may otherwise be electrically isolated from one another. Usually the two electrical circuits operate at different voltages, and thus, are electrically isolated. For example, consider an application in which a 5V battery powered controller board is configured to control a motor circuit operating at 240V. In this example, the 240V motor circuit may be electrically isolated from the 5V controller circuit, while permitting the 5V controller circuit to send or receive signals from the 240V motor circuit. In another example involving a solid-state lighting system, a 240V Alternate Current (AC) power supply may be converted to two different Direct Current (DC) power domains. The two DC power domains are electrically isolated as there is no direct current path between the two DC domains, but there may be control signals that need to be communicated between the two power domains. In these applications, an isolator may be used to provide voltage and/or noise isolation while still permitting signaling and/or information exchange between the two circuit systems.

Galvanic isolators may be further categorized into opto-isolators, capacitive isolators, magnetic isolators and radio frequency based isolators depending on the technology used to electrically isolate the electrical circuits from one another. An opto-isolator may comprise an optical emitter and an optical receiver. Over time, degradation may occur and optical signals emitted from the optical emitter may degrade. Opto-isolators are usually for low frequency applications because photodiode as well as light-emitting diodes used as emitter in most capacitive isolators have built-in-capacitance that limits the transmission speed of opto-isolators.

Capacitive isolators may not have the optical degradation issue of the opto-isolators. However, incorporating high voltage capacitor into a semiconductor die may be technically challenging. Capacitors that are fabricated by using conventional semiconductor process may not meet the requirement of high voltage tolerance. For example, opto-isolators may be able to meet isolation requirement such as breakdown voltage specification of 8 kV. However, typically most capacitive isolators fabricated under conventional CMOS process have breakdown voltage of 2 kV, which is relatively low compared to opto-isolators.

Most capacitive isolators available today have off-chip capacitors relying on capacitors outside a semiconductor package. Some of these capacitive isolators may have capacitors arranged in series in order to meet the breakdown voltage specification. However, having capacitors in series also means floating electrical node that is not testable, and may be susceptible to noise.

BRIEF DESCRIPTION OF THE DRAWINGS

Illustrative embodiments by way of examples, not by way of limitation, are illustrated in the drawings. Throughout the description and drawings, similar reference numbers may be, but not necessarily, used to identify similar elements. The drawings are for illustrative purpose to assist understanding and may not be drawn per actual scale. Some of the drawings may be simplified to show key features, appearances, and/or working principles in order to assist understanding.

FIG. 2H illustrates a diagrammatic cross-sectional view of a third alternative trench that terminates at a topmost interconnect metal layer;

FIG. 2I illustrates a diagrammatic cross-sectional view of a fourth alternative trench that terminates at an edge stop layer;

FIG. 2J illustrates a diagrammatic cross-sectional view of a fifth alternative trench that is filled partially by a passivation layer;

DETAILED DESCRIPTION

Figure 1:
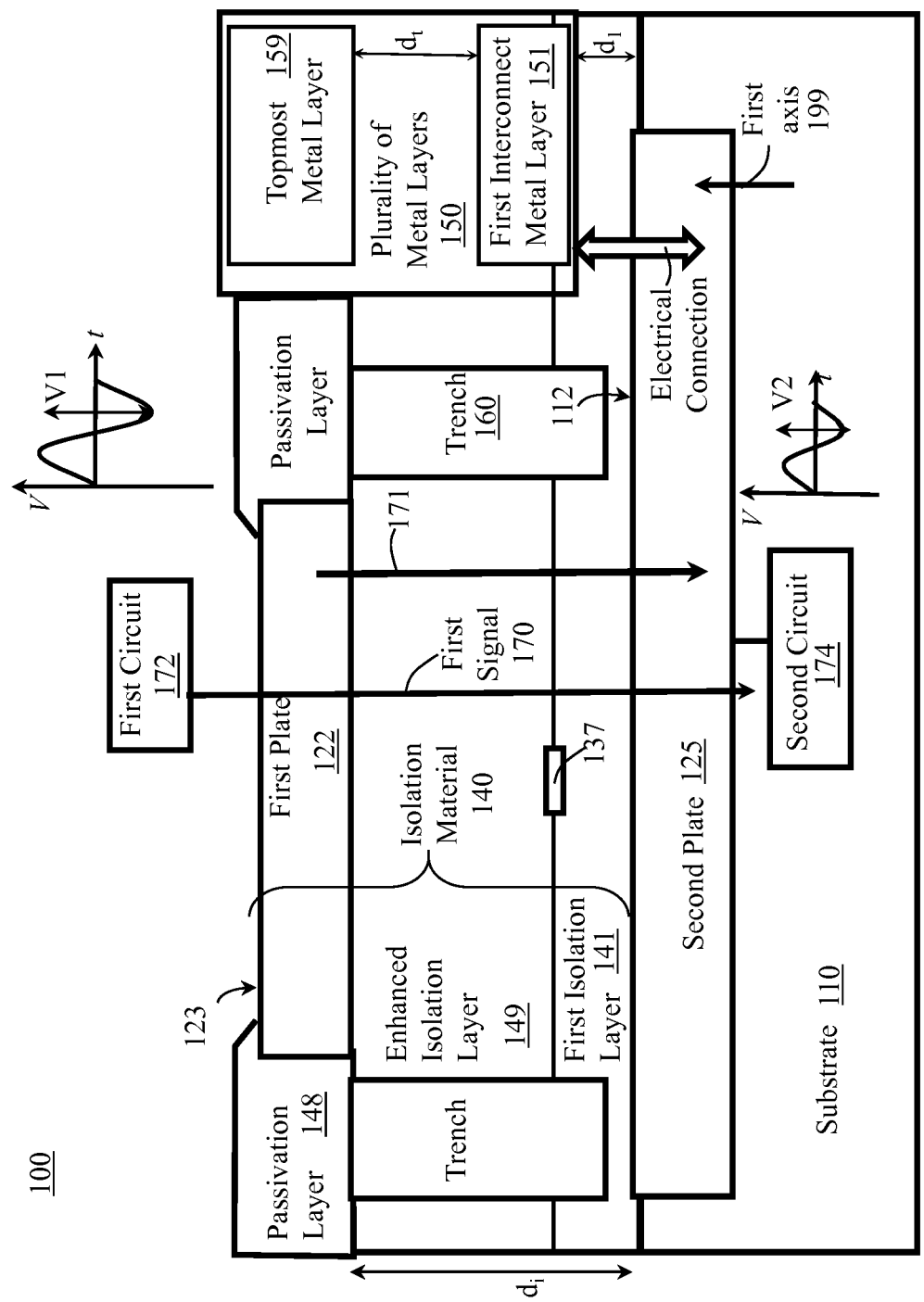
FIG. 1 illustrates an illustrative block diagram of an isolation device.

FIG. 1A depicts an illustrative block diagram of an isolation device 100. The isolation device 100 may be implemented in a semiconductor die. The isolation device 100 may be operable to isolate a first circuit 172 from a second circuit 174 while allowing a first signal 170 to be transmitted from the first circuit 172 to the second circuit 174. The isolation device 100 may comprise a substrate 110, a plurality of metal layers 150, an isolation material 140, a first plate 122, a second plate 125, at least one trench 160, and a passivation layer 148.

The substrate 110 may have a first surface 112 facing the first plate 122 and the second plate 125. The substrate 110 may be a thin silicon wafer in which the first surface 112 may be further processed to form one or more integrated circuits. The plurality of metal layers 150 may be disposed adjacent to the first surface 112. The plurality of metal layers 150 may comprise a first interconnect metal layer 151 and a topmost metal layer 159. The plurality of metal layers 150 may comprise additional metal layers other than the first interconnect metal layer 151 and the topmost metal layer 159. The plurality of metal layers 150 may comprise between three to eight metal layers, but in the future, there may be even more metal layers introduced. Each of the plurality of the metal layers 150 may be substantially parallel to the first surface 112. The first interconnect metal layer 151 may be positioned closest to the first surface 112 measuring along a first axis 199. The first axis 199 may be substantially perpendicular to the first surface 112. The first interconnect metal layer 151 may be positioned at a first distance $d_1$ away from the first surface 112.

The topmost metal layer 159 may be positioned furthest from the first surface 112 measuring along the first axis 199. The topmost metal layer 159 may be positioned at a topmost distance $d_t$ away from a first adjacent metal layer formed nearest to the topmost metal layer 159 measuring along the first axis 199. The first adjacent metal layer may be the first interconnect metal layer 151 if there is no other additional metal layer. The topmost distance $d_t$ may be at least three times the first distance $d_1$. In the embodiment shown in FIG. 1, the first distance $d_1$ may be approximately one micrometer and the topmost distance $d_t$ may be at least four micrometers. In one embodiment the topmost distance $d_t$ may be at least ten micrometers. In yet another embodiment, the topmost distance $d_t$ may be more than twelve micrometers. The topmost distance $d_t$ of the isolation device 100 may be one parameter that may eventually determine the breakdown voltage of the isolation device 100.

The isolation distance $d_i$ may be defined as the distance between the first plate 122 and the second plate 125 as illustrated in FIG. 1. The isolation distance $d_i$ may be approximately equal to the topmost distance $d_t$ for an isolation device 100 fabricated using only two metal layers 150 with the bottom metal layer 151 being used to make the second plate 125. However, in most cases, the topmost distance $d_t$ is different from the isolation distance $d_i$ as there may be more additional interconnect metal layer as illustrated in subsequent embodiments. The topmost distance $d_t$ may contribute primarily to the determination of the isolation distance $d_i$.

The isolation distance $d_i$, the first distance $d_1$, and the topmost distance $d_t$ shown in the illustrative block diagram may be substantially uniform. However, in some embodiments, the plurality of metal layers 150, the first plate 122 and the second plate 125 may not be completely flat, and thus, the isolation distance $d_i$, the first distance $d_1$, and the topmost distance $d_t$ may differ depending on the location where the measurement is taken. However, the difference may be too small and insignificant. For avoidance of doubt, the isolation distance $d_i$, the first distance $d_1$, and the topmost distance $d_t$ for actual physical devices would be the average effective distance measured per the definition defined above.

The isolation material 140 may surround the plurality of metal layers 150 but expose a surface 123 of the topmost metal layer 159. The isolation material 140 may comprise one or more passivation layers 148 covering the topmost surface 123 of the first plate 122, as well as all surfaces of all other metal layers 150 exposed outside the isolation device 100. For example, in the embodiment shown in FIG. 1, the topmost surface 123 of the first plate 122 is exposed and configured to receive a first wire bond (not shown). In other words, the first plate 122 may be a bond pad configured to be exposed externally so as to receive a wire bond or a bond ball for external electrical connections. The isolation device 100 may comprise additional plurality of bond pads exposed outside the isolation device 100 for receiving wire bonds or solder balls. The additional plurality of bond pads may be a portion of the topmost metal layer 159 as illustrated in the embodiment shown in FIG. 3A. Alternatively, the isolation device 100 may comprise additional plurality of bond pads formed using a metal layer other than the topmost metal layer 159 as shown in the embodiment illustrated in FIG. 2A.

As shown in FIG. 1, a portion of the isolation material 140 may be sandwiched between the first plate 122 and the second plate 125. The isolation material 140 may allow capacitive coupling signals 171 to travel between the first plate 122 and the second plate 125 enabling communication between the first circuit 172 and second circuit 174 even though the first circuit 172 and second circuit 174 are electrically isolated from one another.

The isolation material 140 may comprise a plurality of isolation layers such as a first isolation layer 141, the enhanced isolation layer 149, and the passivation layer 148. The enhanced isolation layer 149 may be disposed adjacent to the topmost metal layer 159. The enhanced isolation layer 149 may be substantially thicker than each of all other plurality of isolation layers 141. The enhanced isolation layer 149 may comprise high isolation materials such as polyimide. The isolation material 140 may also comprise silicon dioxide or silicon nitride in substantial quantities without departing from the scope of the present disclosure.

The enhanced isolation layer 149 may be the primary layer of the isolation material 140 providing electrical isolation between the first plate 122 and the second plate 125. While not intended, depositions of electrically conductive impurities and residue materials may exist between the plurality of isolation layers 141. For example such depositions of residue materials 137 may be disposed between the first isolation layer 141 and the enhanced isolation layer 149 as shown in FIG. 1. This may be highly undesirable as the residue materials 137 may provide an unwanted electrical path. When a high electric field is applied across the capacitive element between the first plate 122 and the second plate 125, these unwarranted electrical paths may subsequently breakdown and may damage the isolation device 100. One way to break such unwanted electrical breakdown path is by having the at least one trench 160 to intercept the unwarranted electrical path and to cut off the potential leakage current that may flow through the residue materials 137.

The at least one trench 160 may extend at least partially through the isolation material 140 in a direction substantially perpendicular to the first surface 112. The at least one trench 160 may be positioned adjacent to the first plate 122 and the second plate 125. The at least one trench 160 may be looping around the first plate 122 planarly on a plane parallel to the substrate 110. In this way, the at least one trench 160 may interrupt and break any potential break-down path caused by the residue materials that exist on the plane between the isolation layers 141, 149. The at least one trench 160 may extend through the enhance isolation layer 149 so as to interrupt electrical paths that may exist between the enhanced isolation layer 149 and the passivation layer 148.

The isolation device 100 may comprise at least two circuits 172, 174 such as the first circuit 172 and the second circuit 174 that may be electrically isolated from one another. For example, the first circuit 172 may comprise the first plate 122, and the second circuit 174 may be all other portions of the isolation device 100 outside the first plate 122. On many occasions, the first circuit 172 and the second circuit 174 may be connected to different power sources, different ground or reference voltages, or to different regulated power supply nodes that may originate from a single power supply. The different power sources and the different regulated power nodes may have different operating voltages. For example, the first signal 170 may be coupled to the first plate 122. The first signal 170 may operate within a first voltage range V1. The second plate 125 may be configured to be biased within a second voltage range V2. The first voltage range V1 may be substantially larger than the second voltage range V2.

The first signal 170 may be transmitted from the first circuit 172 to the second circuit 174 through a coupling device formed using the first plate 122 and the second plate 125. For example, the first plate 122 and the second plate 125 may form an isolation capacitor in which the first signal 170 may be converted into a capacitive coupling signal 171. The first plate 122 may form a first capacitive element, whereas the second plate 125 may form the second capacitive element. The first plate 122 may be a portion of the topmost metal layer 159. The first plate 122 may be coupled directly to the first circuit 172 so as to receive the first signal 170. For example, the first plate 122 may be wire bonded or electrically connected to other portions of the first circuit 172. The first plate 122 may be isolated from all other plurality of metal layers 150.

The second plate 125 may be disposed adjacent to the first plate 122 but be distanced away and electrically isolated from the first plate 122. The second plate 125 may be configured to indirectly receive the first signal 170 via a capacitive coupling between the second plate 125 and the first plate 122. The second plate 125 may be electrically connected to the second circuit 174. For example, the second plate 125 may be coupled electrically to a via and subsequently electrically coupled to the second circuit 174 through the plurality of metal layers 150.

The first plate 122 and the second plate 125 may be positioned in parallel to each other. The first plate 122 and the second plate 125 may be substantially in parallel such that the second plate 125 may be configured to receive the first signal 170 through the capacitive coupling signal 171 without receiving an electrical current directly from the first circuit 172. The first plate 122 may be spaced apart from the second plate 125 through the isolation material 140.

The first plate 122 and the second plate 125 may be made from highly electrically conductive materials such as one of the plurality of metal layers 150. However, the first plate 122 and the second plate 125 may be formed using other materials such as poly-silicon, or highly doped diffusion layers.

The block diagram shown in FIG. 1 is illustrated without associating the isolation device 100 with a specific arrangement, or being fabricated using a specific process. Subsequent embodiments may show drawings illustrating the similar device using a specific arrangement or using a specific process. All components shown in subsequent embodiments that are in common with the isolation device 100 may share similar characteristics or may be identical.

Figure 2A:
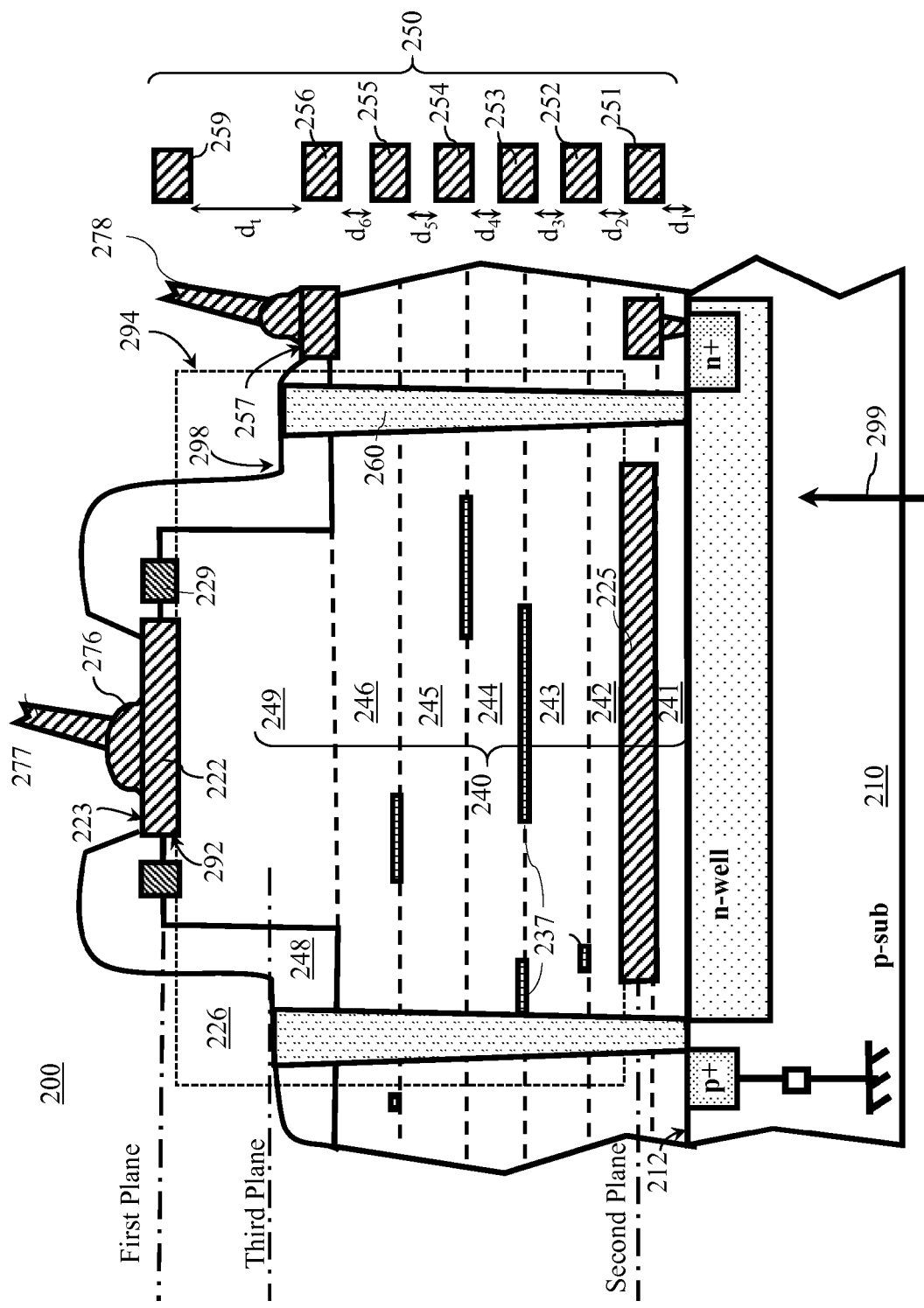
FIG. 2A shows a diagrammatic cross sectional view of an isolation device.
Figure 2B:
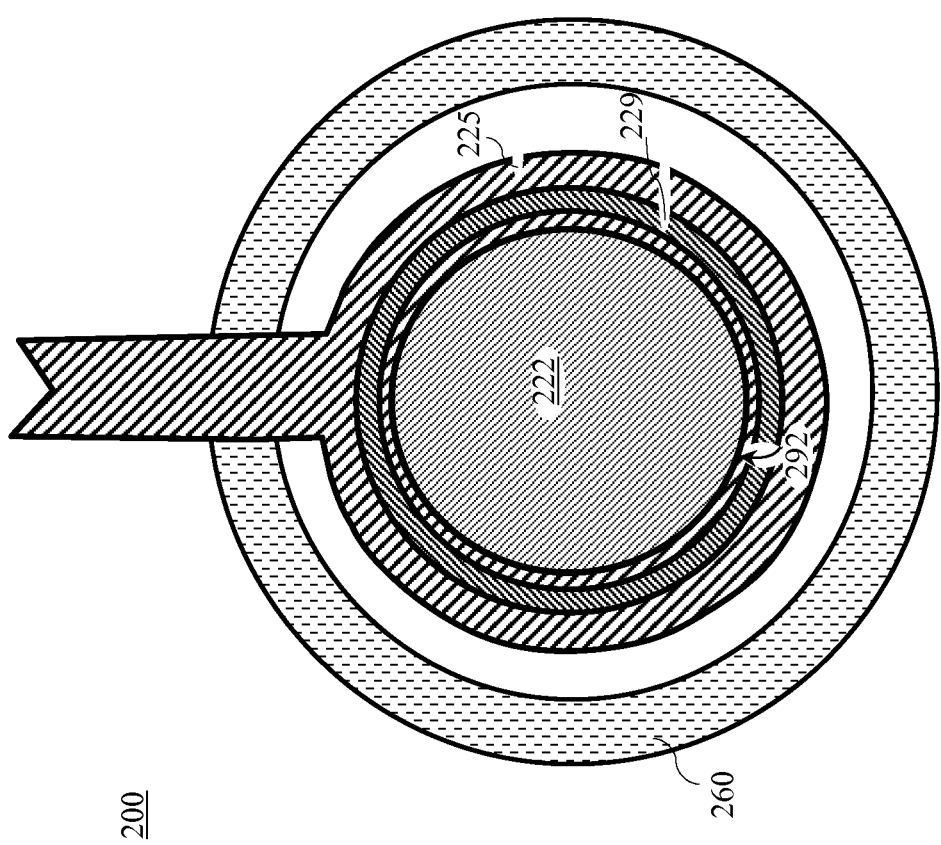
FIG. 2B shows a diagrammatic top view of the isolation device shown in FIG. 2A.

FIG. 2A shows a diagrammatic cross sectional view of an isolation device 200. FIG. 2B shows a diagrammatic top view of the isolation device 200 shown in FIG. 2 without showing all layers of the isolation device 200 to keep the top view simple. The isolation device 200 may be made using a CMOS manufacturing process, a bipolar process or a bi-CMOS process. The embodiment shown in FIG. 2A primarily illustrates back-end processed layers that may be used in any of the process illustrated above. Back-end process usually refers to processing of metal layers 250 and all subsequent process steps in manufacturing a semiconductor die. While terminology of the layers may follow those in CMOS process, the front-end layers (prior to forming metal layers 250) may be applicable to bipolar process, a bi-CMOS process or any other semiconductor integrated circuit manufacturing process.

Referring to FIGS. 2A-2B, the isolation device 200 may comprise a substrate 210, a plurality of metal layers 250, a first plate 222, a second plate 225, an iso-potential ring 229, an isolation zone 226, an isolation material 240, at least one trench 260, and a passivation layer 248. The iso-potential ring 229, the at least one trench 260 and the isolation zone 226 may be optional.

The number of layers of the plurality of metal layers 250 may depend on the technology chosen for the isolation device 200. For example, the isolation device 200 may be implemented in a six metal layers process may have a total of six metal layers. If implemented in a four metal layers process, the plurality of metal layers 250 may have a total of four metal layers. As shown in FIG. 2A, the isolation material 240 may comprise the passivation layer 248, a plurality of isolation layers 241-246 and a neck portion of isolation layer 249. Each of the isolation layers 241-246 and the neck portion 249 may separate each of the metal layers 250. In other words, each of the plurality of isolation layers 241-246 may be sandwiched between two adjacent metal layers of the plurality of metal layers 250, or between the first interconnect metal layer 251 and the substrate 210.

The plurality of metal layers 250 and the plurality of isolation layers 241-246 may be formed layer-by-layer, one on top of another. This process may also be referred as multi-metallization structure. The neck portion 249 may be disposed on the topmost isolation layer 246 on an area adjacent to the first plate 222 but not covering the entire isolation device 200. As illustrated in FIG. 2A, the neck portion 249 may be protruding in a direction substantially along a first axis 299 that is substantially perpendicular to the substrate 210.

The plurality of isolation layers 241-246 may comprise inter-metal dielectric layers (referred hereinafter as "IMD"), or inter level dielectric (referred hereinafter as "ILD"). IMD or ILD is a dielectric material used to electrically separate closely spaced interconnect lines arranged in several levels (multilevel metallization) in an advanced integrated circuit. IMD or ILD may feature low dielectric constant k as close to 1 as possible to minimize capacitive coupling between adjacent metal lines. Each of the plurality of isolation layers 241-246 may be made from silicon dioxide, silicon nitride or any other similar isolative material.

In the embodiment shown in FIG. 2A, the plurality of metal layers 250 may comprise the topmost metal layer 259 and a plurality of interconnect metal layers 251-256 as illustrated on the right hand side of the diagrammatic cross-sectional view. The plurality of interconnect metal layers 251-256 may be primarily configured to electrically interconnect various portions of the isolation device 200 that are isolated from the first plate 222. Therefore, the plurality of interconnect metal layers 251-256 may be electrically interconnected to each other, or to any lower layer of the substrate 210 through a via.

The plurality of interconnect metal layers 251-256 may comprise the first interconnect metal layer 251 and a topmost interconnect metal layer 256. The first interconnect metal layer 251 may be the metal layer positioned closest to the substrate 210. The topmost interconnect metal layer 256 may be the metal layer positioned closest to the topmost metal layer 259. There may be additional interconnect metal layers 252-255 between the first interconnect metal layer 251 and the topmost interconnect metal layer 256.

For example, the plurality of interconnect metal layers 251-256 may further comprise a second interconnect metal layer 252. The second interconnect metal layer 252 may be disposed adjacent to the first interconnect metal layer 251 such that the first interconnect metal layer 251 may be sandwiched between the second interconnect metal layer 252 and the substrate 210. The plurality of interconnect metal layers 251-256 may further comprise a third interconnect metal layer 253 disposed adjacent to the first interconnect metal layer 251 such that the second interconnect metal layer 252 is sandwiched between the first interconnect metal layer 251 and the third interconnect metal layer 253. The second plate 225 may be formed by a portion of the second interconnect metal layer 252, the third interconnect metal layer 253 or any other layers of the plurality of interconnect metal layers 254-256.

Optionally, the topmost metal layer 259 may be a layer dedicated for isolation purposes. For example, the topmost metal layer 259 may be configured to form the first plate 222 of the isolation device 200 that is not electrically interconnected to other portions of the isolation device 200. The plurality of interconnect metal layers 251-256 may be electrically isolated from the topmost metal layer 259. Each of the plurality of interconnect metal layers 251-256 may be connected to at least one other layer of the plurality of interconnect metal layers 251-256 but isolated from the topmost metal layer 259. The topmost metal layer 259 is chosen to form the top plate 222 that comprise a surface 223 so as to wire bond the top plate 222 to an external circuit. As shown in FIG. 2A, the surface 223 is connected to a bond ball 276 and a wire bond 277.

The isolation material 240 may comprise an enhanced isolation layer 249. The enhanced isolation layer 249 may have higher isolation capabilities in that the enhanced isolation layer 249 may have at least one of the following properties. First, the enhanced isolation layer 249 may have substantially higher thickness. Second, the enhanced isolation layer 249 may be made or mixed with highly isolative material such as polyimide.

The topmost interconnect metal layer 256 may comprise at least one surface 257 for external electrical connections similar to that of the surface 223 of the topmost metal layer 259. For example, the surface 223 of the topmost metal layer 259 and at least one surface 257 of the topmost interconnect metal layer 256 may be exposed without being covered by the isolation material 240 so as to receive wire bonds 278 respectively. The surface 223 of the topmost metal layer 259 and the at least one surface 257 may be electrically connected to different external circuits.

The first interconnect metal layer 251 may be positioned at a first distance $d_1$ away from the substrate 210. The plurality of interconnect metal layers 251-256 may be positioned at respective distances $d_2$-$d_6$ away from an adjacent metal layer respectively as shown in FIG. 2A. The distances $d_1$-$d_6$ may be approximately between 0.8-1.6 microns. In the embodiment shown in FIG. 2A, the first distance $d_1$ may be relatively lower than the respective distances $d_2$-$d_6$. Each of the plurality of interconnect metal layers 251-256 may be positioned at equal distance from each other and hence each of the distances $d_2$-$d_6$ may be approximately equal to an average value $d_{avg}$. For example, the first distance $d_1$ may be approximately 1 micron but each of the distances $d_2$-$d_6$ may be approximately 1.5 micron.

As shown in FIG. 2A, the topmost metal layer 259 may be positioned at a topmost distance $d_t$ away from the topmost interconnect metal layer 256. The height of the neck portion 249 may have a height that is approximately the topmost distance $d_t$. The topmost distance $d_t$ may be at least three times the average value $d_{avg}$ of the respective distances $d_2$-$d_5$. The topmost distance $d_t$ may be at least four times the first distance $d_1$.

The distance $d_c$ between the first plate 222 and the second plate 225 may be the sum of the topmost distance $d_t$ the distances $d_2$-$d_6$ as illustrated by the formula below:

$$d_c = d_t + d_2 + d_3 + d_4 + d_5 + d_6$$

If the second plate 225 is implemented using other layers, the formula may need to be adjusted accordingly by adding or taking out the relevant distances $d_1$-$d_6$ between the plurality of interconnect metal layers 251-256. For example, if the second plate 225 is implemented using the second interconnect metal layer 252, the distance $d_c$ between the first plate 222 and the second plate 225 may be the sum of the topmost distance $d_t$ the distances $d_3$-$d_6$ as illustrated by the formula below:

$$d_c = d_t + d_3 + d_4 + d_5 + d_6$$

The breakdown voltage of the isolation device 200 may depend on the value of $d_c$, and therefore, may be theoretically adjusted through any of the parameters $d_2$-$d_6$ and $d_t$. However, practically the topmost distance $d_t$ may be a more effective parameter to adjust compared to others because the topmost layer of isolation material 249 is next to the first plate 222. In addition, while adjusting the topmost distance $d_t$ has no effect on the entire isolation device 200, adjusting other parameters such as the $d_1$-$d_6$ may affect parasitic capacitances of wire traces and affect performance of other circuitry. Another reason that adjusting the topmost distance $d_t$ may be more effective is that a residue material 237 may be formed under the neck portion 249 of the isolation material 240 and not within the isolation material 240. As explained in subsequent paragraph, the residue material 237 may weaken the breakdown voltage of the isolation device 200.

The passivation layer 248 may be configured to cover the substrate 210, the plurality of metal layers 250 and the first plate 222. The passivation layer 248 may be configured to expose an external surface 223 of the first plate 222 and at least one additional portion of the topmost metal layer 259 so as to receive at least one of a solder ball 276 and a wire bond 277. In another embodiment, the passivation layer 248 may extend planarly in parallel with the topmost isolation layer 246 without covering the neck portion 249 of the isolation material. The neck portion 249 may be disposed on the passivation layer 248 but covered by an additional passivation layer.

Referring to FIG. 2A and FIG. 2B, the topmost metal layer 259 may comprise the iso-potential ring 229 disposed around the first plate 222. The iso-potential ring 229 may be electrically isolated from other portions of the topmost metal layer 259 and the topmost interconnect metal layer 256. In addition, the iso-potential ring 229 may be disposed at a predetermined fixed distance from the first plate 222 measuring horizontally from the plate perimeter 292 of the first plate 222. The iso-potential ring 229 may be disposed completely surrounding the first plate 222. For example, the first plate 222 may have a plate perimeter 292. The iso-potential ring 229 may be disposed at a predetermined distance away from the plate perimeter 292 and hence a ring-shape iso-potential ring 229 may be formed. The iso-potential ring 229 may be located approximately more than 5 microns from the plate perimeter 292 of the first plate 222. The iso-potential ring 229 may be concentric with the first plate 222. The at least one trench 260 may be surrounding the iso-potential ring 229 as shown in FIG. 2B.

In the embodiment shown in FIG. 2A, the iso-potential ring 229 may be disposed adjacent the first plate 222 on a plane that is substantially parallel to the substrate 210. In another embodiment, the iso-potential ring 229 may be a portion of other metal layers 251-256 forming a ring shape on a plane that may be vertically distance away from the first plate 222. In yet another embodiment, the isolation device 200 may comprise an additional iso-potential ring disposed on one of the interconnect metal layers 251-256 in addition to the iso-potential ring 229 formed using the topmost metal layer 259.

Figure 2C:
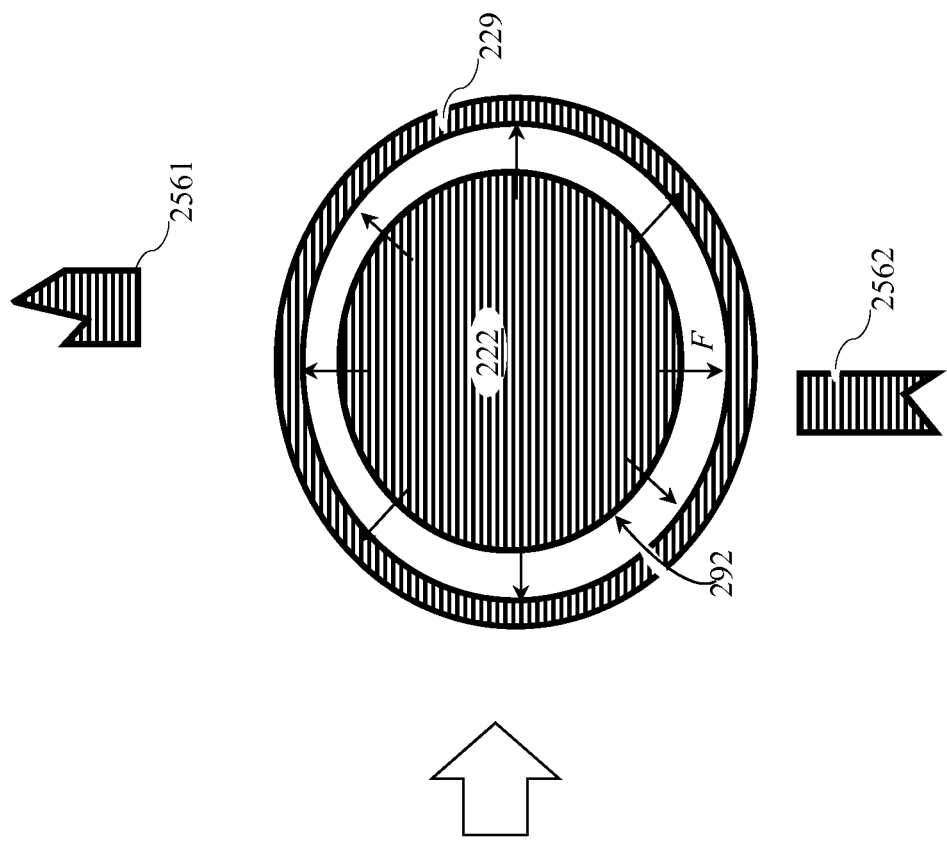
FIG. 2C illustrates an exemplary diagram showing how the iso-potential ring 229 works.
Figure 2C:
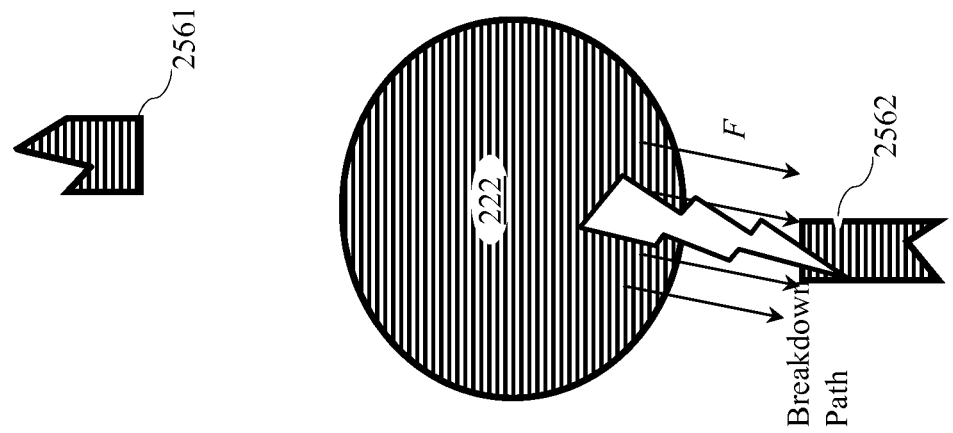

The iso-potential ring 229 may be configured to evenly distribute the electric field generated from the first plate 222 to avoid creating a breakdown path resulted from neighboring metal layers 251-256. This may be explained through an example in FIG. 2C. FIG. 2C illustrates an exemplary diagram illustrating how the iso-potential ring 229 works. For example, the first plate 222 may be electrically biased at a fixed voltage level. Depending on the voltage level of the surrounding interconnect metal layers such as the metals 2561, 2562, the electric field F adjacent to the first plate 222 may be uneven. In the embodiment shown in FIG. 2C, the electric field F may be concentrated at one side, causing a potential breakdown path near the metal 2562 because the metal 2562 is located nearer to the first plate 222. However, if an iso-potential ring 229 is disposed surrounding the first plate, such uneven electric field F may be avoided.

The iso-potential ring 229 may be an optional feature that may increase the high voltage tolerance as well as reliability performance of the isolation device 200. Another way that may increase the high voltage tolerance and reliability performance may be by having an isolation zone 226. Similarly, the isolation zone 226 may be optional, may be formed with or without the iso-potential ring 229.

Referring to FIG. 2A, the isolation zone 226 may be devoid of the plurality of metal layers 250 surrounding the first plate 222 other than the optional iso-potential ring 229 or other residue materials 237 that may exist out of the manufacturing control. The isolation zone 226 may comprise the at least one trench 260 extending through the isolation material 240 surrounding the iso-potential ring 229 along the first axis 299. The isolation zone 226 may enable electric flux from the first plate 222 to reach the second plate 225, and may be configured avoid formation of unwanted breakdown path as illustrated in FIG. 2C.

The isolation zone 226 may extend substantially perpendicularly relative to the first plate 222 between the first plate 222 and the second plate 225. The isolation zone 226 may has a zone perimeter 294. The zone perimeter 294 may extend outwardly from the plate perimeter 292. The zone perimeter 294 of the isolation zone 226 may extend at least twenty microns outwardly from the plate perimeter 292.

The second plate 225 may be a portion of the first interconnect metal layer 251 as shown in FIG. 2A. The isolation device 200 may comprise a protective well disposed below the second plate 225 so as to electrically isolate the second plate 225 from a portion of the substrate 210 surrounding the second plate 225. The protective well 294 may be N-type or a P-type well that is electrically disconnected from the substrate 210. Metal layers may be highly conductive and suitable for making the second plate 225, but the second plate 225 may be a portion of any other layers as illustrated in FIG. 2D.

Figure 2D:
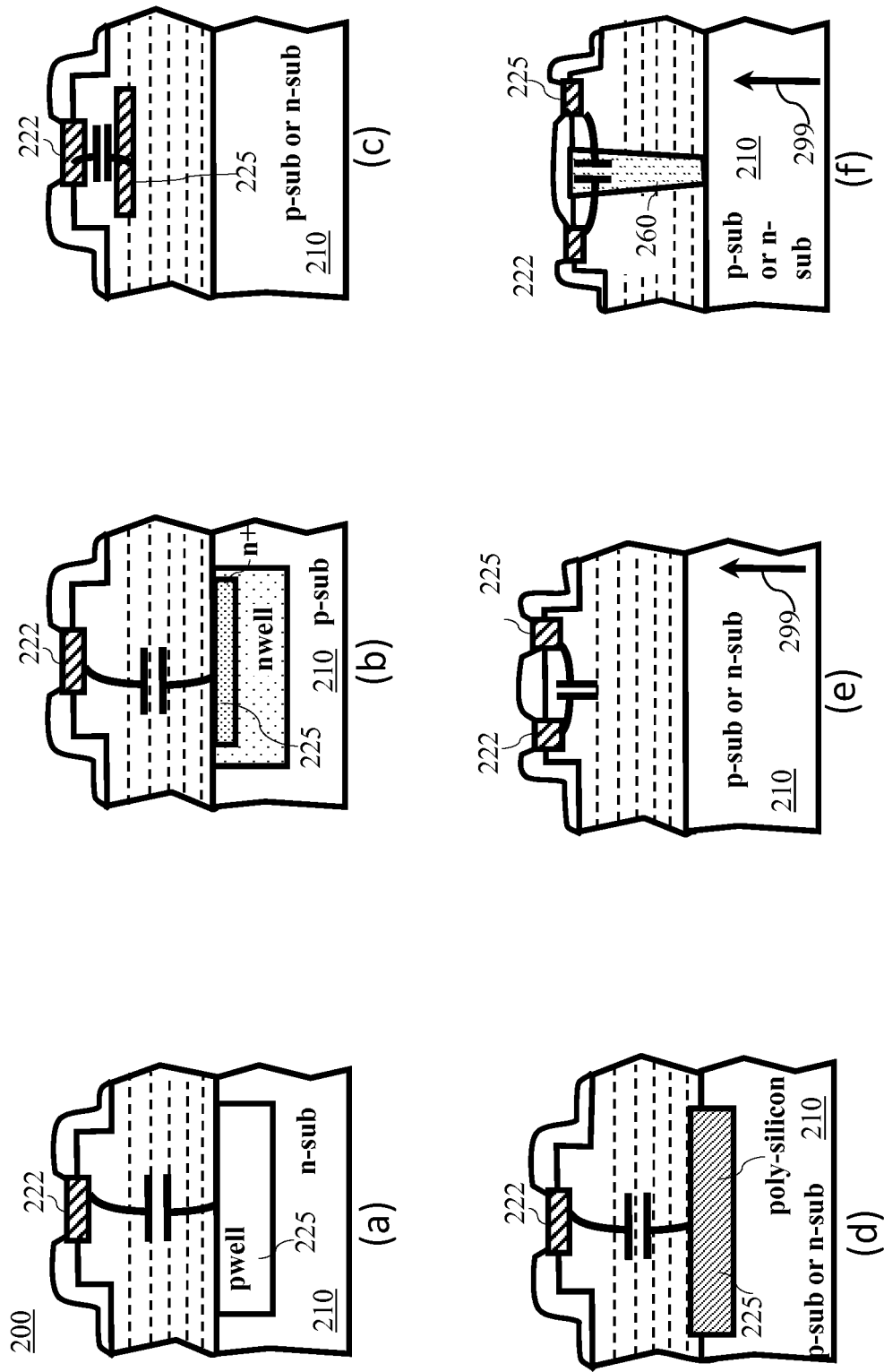
FIG. 2D illustrates various implementations of the second plate of the isolation device shown in FIG. 2A.

FIG. 2D illustrates various implementations of the second plate 225. The first plate 222 remain the same as FIG. 2A. For example, the second plate 225 may be a portion of a well layer having higher electrical conductivity relative to the substrate 210 as shown in FIG. 2D(a), an active region or a region within the substrate 210 that may be highly doped as shown in FIG. 2D(b), a topmost interconnect metal layer as shown in FIG. 2D(c), a highly-doped poly-silicon layer as shown in FIG. 2D(d), or a topmost metal layer as shown in FIG. 2D(e) and FIG. 2D(f). The second plate 225 and the first plate 222 may be positioned side-by-side on a substantially flat plane such that each of the second plate 225 and the first plate 222 has side surfaces extending substantially along the first axis 299 facing each other. As shown in FIG. 2D(f), the at least one trench 260 may extend into the substantially flat plane separating the first plate 222 and the second plate 225. In this arrangement, the at least one trench 260 extends substantially in parallel with the first axis 299. The substrate 210 may be p-type or n-type as indicated in FIG. 2D.

Referring to FIG. 2A, the first plate 222 may extend substantially planarly on a first plane. The second plate 225 may extend on a second plane that is substantially parallel to the first plane but distanced away from the first plane. As shown in FIG. 2A, the first plate 222 and the second plate 225 may be arranged such that both the first plate 222 and the second plate 225 are substantially in parallel with a first external surface 298 of the isolation device 200. The first external surface 298 may extend substantially parallel to the substrate 210 other than the neck portion 249 of the isolation material 240. The at least one trench 260 may extend into the first external surface 298 along the direction that is in parallel with the first axis 299. In other words, the at least one trench 260 may extend substantially orthogonal relative to the external surface 298.

The at least one trench 260 may circumscribe at least one of the first plate 222 and the second plate 225 or both the first plate 222 and the second plate 225 such that the at least one trench forms a closed loop geometrical figure surrounding the at least one of the first plate 222 and the second plate 225. The geometrical figure surrounding the at least one of the first plate 222 and the second plate 225 may be a square, rectangle, circle or any shape having a closed loop. Referring to FIG. 2A and FIG. 2B, the at least one trench 260 may encircle the first plate 222 and the second plate 225 on a third plane that is distanced away but substantially parallel to the first plate 222. As shown in FIG. 2B, the at least one trench forms a circular shape surrounding the first plate 222. The external surface 298 may be located on the third plane. The at least one trench 260 may be coaxially aligned to at least one of the first plate 222 and the second plate 225, or both the first plate 222 and the second plate 225.

In one embodiment, the at least one trench 260 may be disposed on the neck portion 249 of the isolation material 240 encircling the first plate 222 on the first plane. In another embodiment, the at least one trench 260 and the second plate 225 may be disposed on the third plane such that the at least one trench 260 may be encircling the second plate 225 and being vertically distanced away from the first plate 222.

In yet another embodiment, the at least one trench 260, the first plate 222 and the second plate 225 may be positioned on the third plane where the external surface 298 is located. The at least one trench 260 may circumscribe one of the first plate 222 and the second plate 225, but not both. For example, the at least one trench 260 may encircle the second plate 225 on the second plane. Various implementations of the at least one trench 260 discussed in previous paragraphs may be applied in combination using additional trenches (not shown).

Figure 2E:
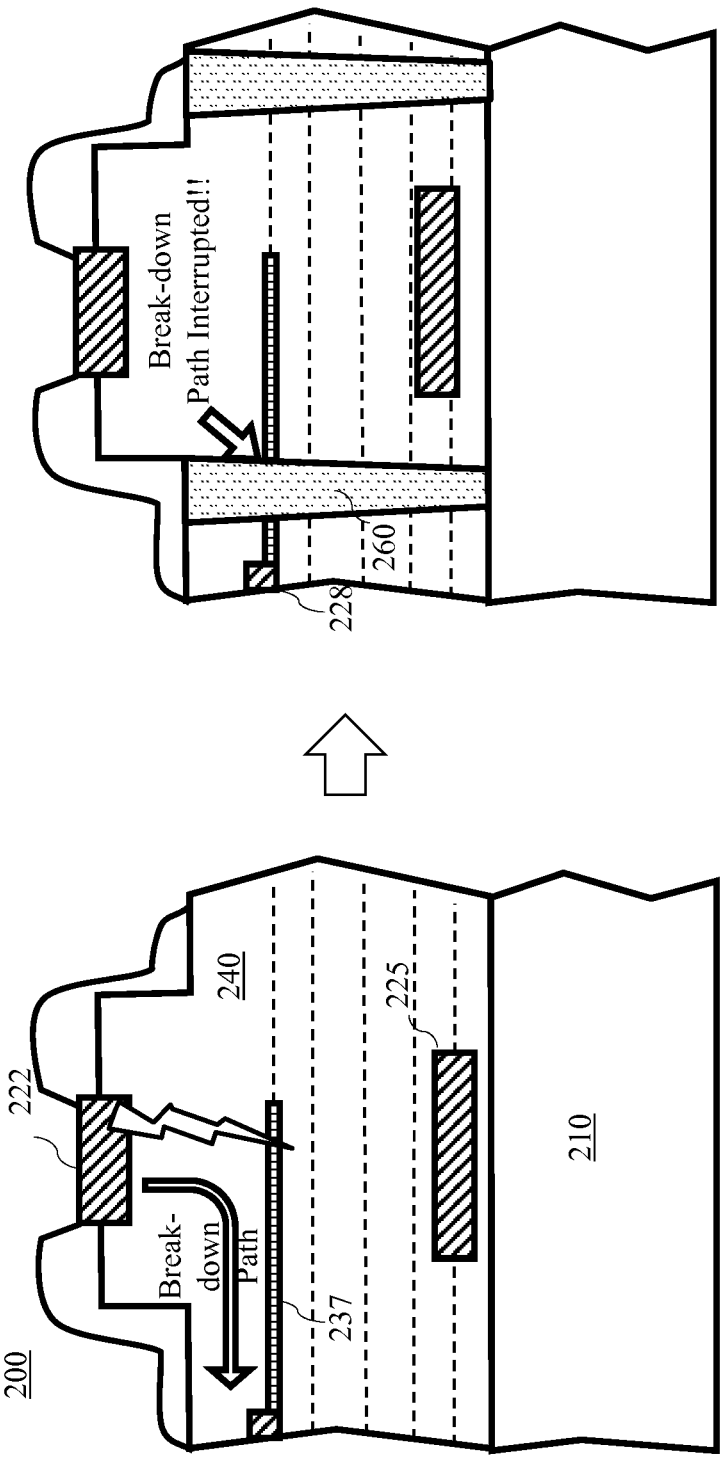
FIG. 2E illustrates an exemplary diagram showing how the trench intercepts a residue material.

FIG. 2E illustrates how the at least one trench 260 may be employed to improve isolation voltage. As the isolation material 240 are formed layers by layers along with formation of the plurality of metal layers 250, residue materials 237 may be trapped within the isolation material 240. The residue materials 237 may be unintentional by-products that may be highly conductive relative to the isolation material 240. The residue materials 237 may be metal traces, or deposition of conductive material that exist in extremely small quantities. Generally, the residue materials 237 may be found in parallel to the substrate 210. However, the residue materials 237 may not cover the entire surface of the isolation layers 241-246, but merely a small surface portion on the isolation layers 241-246.

Formation of the residue materials 237 may be unavoidable. As the residue materials 237 are an unintended by-product of the manufacturing process, the residue materials 237 may occur randomly and may have irregular shape. The residue materials 237 may extend planarly in parallel with the substrate 210. Generally the residue materials 237 may be trapped between two of the plurality of isolation layers 241-246 and 249. On some occasions, the residue materials 237 may be in contact with a neighboring metal layer 228 as illustrated in FIG. 2E. As a result, the residue material 237 may cause a potential breakdown path as shown in FIG. 2E. In the example shown in FIG. 2E, the isolation voltage between the top plate 222 and the bottom plate 225 may be 8 kV, but due to the alternate breakdown path caused by the residue materials 237, the isolation voltage may be reduced to 2 kV.

By having the at least one trench 260 that may intercept and cut through the residue material 237, the conductive residue material 237 between the top plate 222 and the bottom plate 225 may be intercepted. For example, as shown in FIG. 2E, the at least one trench 560 may intersect one of the residue materials 237 into two electrically isolated portions. As a result, the electrical path may be broken and the residue material 237 may be unable to provide any current path for breakdown. As a result, the isolation voltage may remain at a higher level. In the example shown in FIG. 2E, the isolation voltage may remain at 8 kV or higher by employing at least one trench 260 to intercept and interrupt the residue materials. By surrounding the first plate 222 and the second plate 225 with the at least one trench 260, potential current path provided by the residue material 237 may be interrupted, ensuring higher isolation voltage in the process.

When the at least one trench 260 surrounds or circumscribes the first plate 222 and the second plate 225 in a complete closed loop manner cutting through the isolation layers 241-246, all potential breakdown path can be completely eliminated. However, some manufacturing process may not allow a complete closed loop trench 260. For isolation devices 200 that are fabricated using such manufacturing process, the at least one trench 260 having curvatures or linear segment of trench members illustrated in FIG. 2F and FIG. 2G may be employed.

Figure 2G:
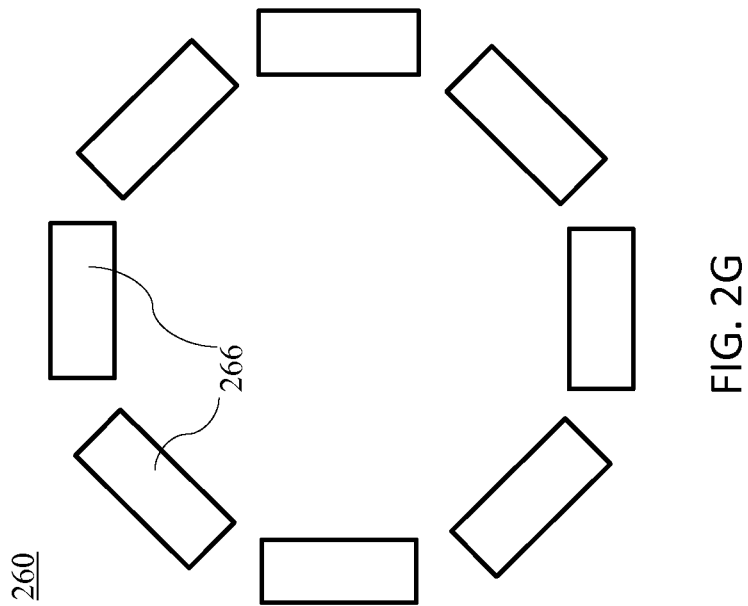
FIG. 2G illustrates a diagrammatic top view of a second alternative trench having a plurality of linear trench members.
Figure 2F:
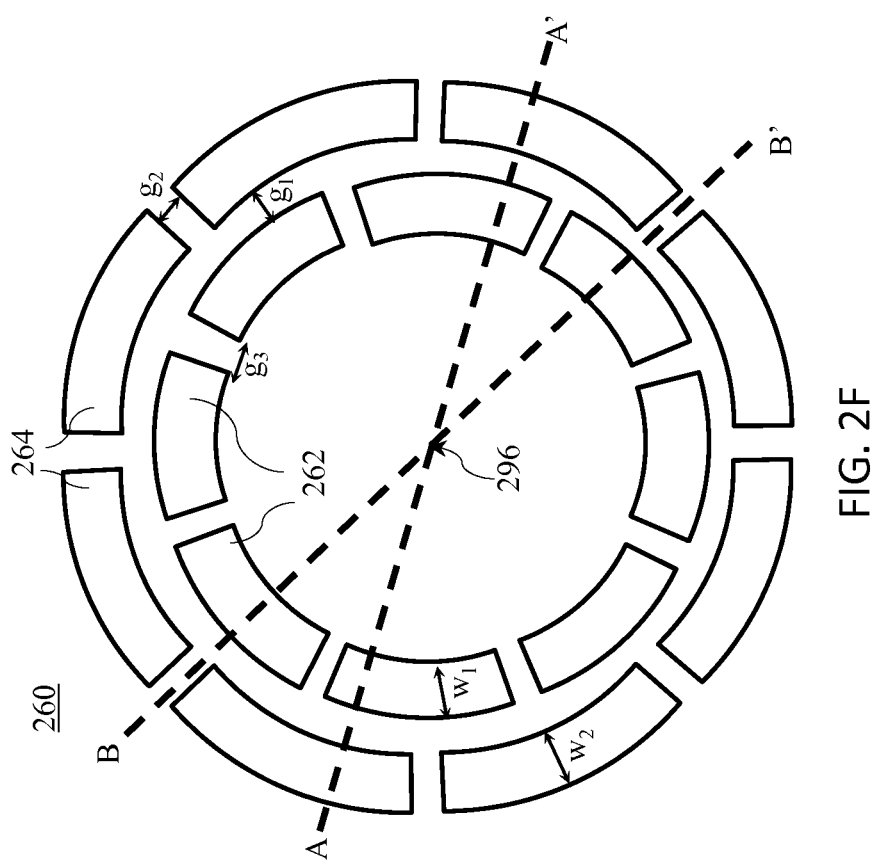
FIG. 2F illustrates a diagrammatic top view of a first alternative trench having a plurality of curvature trench members.

FIG. 2F illustrates a diagrammatic top view of the at least one trench 260 having a plurality of trench members 262. The plurality of trench members 262 may collectively form a partial circular ring. Each of the plurality of trench members 262 may have substantially similar size and shape. The plurality of trench members 260 may collectively encircle the at least one of the first plate 222 and the second plate 225. As shown in FIG. 2F, each of the plurality of trench members 262 may comprise a curvature segment. The curvature segment of each of the plurality of trench members 262 may extend axially from a curvature center 296. The curvature center 296 may be located on at least one of the first plate 222 and the second plate 225.

Similar to the at least one trench 260 shown in FIG. 2A, the plurality of trench members 262 may be surrounding at least one of the first plate 222 and the second plate 225 on a horizontal plane substantially in parallel with the substrate 210. Optionally, the at least one trench 260 may further comprise a plurality of additional trench members 264. The additional trench members 264 may be surrounding the plurality of trench members 262. The plurality of additional trench members 264 and the plurality of trench members 262 may be coaxially aligned.

Each of the trench members 262, 264 may be separated by a distance allowable by the manufacturing process. For optimal size, the separation distances $g_1$-$g_3$ may be at a minimum distance. For example, the separation distances $g_1$-$g_3$ may be less than five microns. The width of the first trench member $w_1$ may be approximately equal to the width of the second trench member $w_2$. Each of the trench members 262, 264 may have a minimum width of less than 10 microns.

Referring to FIG. 2F and FIG. 2A, the plurality of trench members 262 and the plurality of additional trench members 264 may be arranged such that any cross sectional view, taken along a plane substantially perpendicular to the substrate 210 extending through the first plate 222, may intersect at least two cross-sectional trenches of the trench member 262 or the additional trench member 264 sandwiching thereby at least one of the first plate 222 and the second plate 225. For example, a cross sectional view taken along line A-A' will yield two cross-sectional trench members 262, 264, i.e. two trench members 262, 264 on each side of the first plate 222 but a cross sectional view taken along line B-B' will yield one cross-sectional trench member 262, one trench member 262 on each side of the first plate 222 as shown in FIG. 2A.

Alternatively, each of the plurality of trench members 262 may comprise a linear trench segment as illustrated in FIG. 2G. FIG. 2G illustrates a diagrammatic top view of the at least one trench 260 having a plurality of linear trench members 266 without showing the top plate 222. The plurality of linear trench members 266 may form a hexagonal or an octagonal shape surrounding the first plate 222 or the second plate 225.

In the embodiment shown in FIG. 2A, the at least one trench 260 may intercept and extend through the passivation layer 248. The at least one trench 260 may then be filled up using an additional isolation material such as silicon nitride, silicon dioxide, polyimide, a mixture of some or all of the above mentioned material or any other isolative material.

The at least one trench 260 may extend through the entire isolation material 240 touching the substrate 210 as shown in FIG. 2A. Optionally the at least one trench 260 may intercept or extend through one or more isolation layers 241-246 of the isolation material 240 but not the entire isolation material 240 as shown in FIG. 2H, FIG. 2I and FIG. 2G.

For protection purpose, the isolation device 200 may comprise the passivation layer 248 that substantially cover the isolation material 240. The at least one trench 260 may be formed before or after the passivation layer 248 is formed. FIG. 2H illustrates an alternative embodiment of the at least one trench 260 that extends through the passivation layer 248 but not extending through any of the plurality of isolation layers 241-246 shown in FIG. 2A. As shown in FIG. 2H, the at least one trench 260 may stop at an iso-potential ring 229 implemented using a topmost interconnect metal layer 256 shown in FIG. 2A. The embodiment shown in FIG. 2H may be suitable for manufacturing process with impurities or residue materials 237 present mostly at the external surface 298 but at relatively much lower probability within the plurality of isolation layers 241-246 shown in FIG. 2A.

As shown in FIG. 2I, optionally the isolation device 200 may further comprise an etch stop layer 281. The etch stop layer 281 may be disposed between the plurality of isolation layers 241-246. The etch stop layer 281 may be configured to stop the formation of the at least one trench 260 during manufacturing process and thus, the etch stop layer 281 may be connected to a bottom portion of the at least one trench 260. The at least one trench 260 may be filled up before being covered by the passivation layer 248. For example, the at least one trench 260 may be filled up using a dielectric material. The passivation layer 248 may cover the dielectric material. The dielectric material and the isolation material 240 may consist essentially of silicon nitride. The dielectric material and the isolation material 240 may consist essentially of silicon dioxide. The arrangement shown in FIG. 2I may be suitable for manufacturing process in which the formation of passivation layer 248 is clean and substantially free from residue materials 237, but where the formation of the isolation layers 241-246 may be susceptible to formation of residue materials 237.

Another alternative arrangement of the at least one trench 260 is shown in FIG. 2J. FIG. 2J is substantially similar to the embodiment shown in FIG. 2I but differs at least in that the at least one trench 260 may be made large enough that the at least on trench 260 is not filled up with any dielectric material. The passivation layer 248 may be disposed within the at least one trench 260 and hence, the passivation layer 248 may cover substantially an inner portion of the at least one trench 260.

Figure 3:
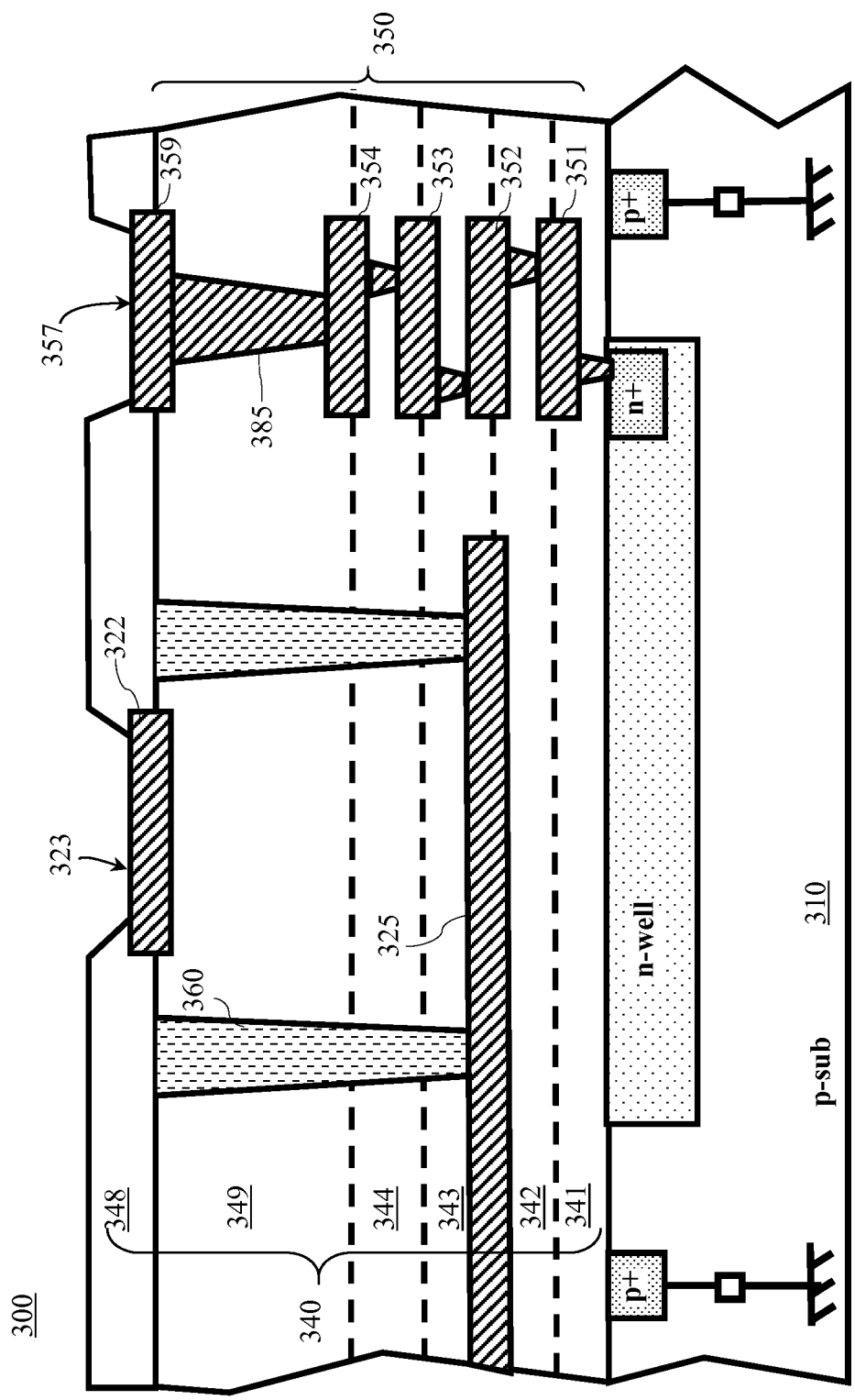
FIG. 3 illustrates a diagrammatic cross sectional view of an isolation device with an enhanced isolation layer with a substantially flat top surface.

FIG. 3 illustrates a diagrammatic cross sectional view of an isolation device 300. The isolation device 300 may comprise a substrate 310, a first plate 322, a second plate 325, an isolation material 340, at least one trench 360, and a plurality of metal layers 350. The plurality of metal layers 350 may comprise a topmost metal layer 359 and a plurality of interconnect metal layers 351-354. The isolation material 340 may comprise a passivation layer 348, an enhanced isolation layer 349, and a plurality of dielectric layers 341-344. The first dielectric layer 341 may be sandwiched between the plurality of interconnect metal layers 351 and the substrate 310. Each of the plurality of dielectric layers 342-344 may be sandwiched between two of the plurality of interconnect metal layers 351-354. The at least one trench 360 may extend through at least two layers of the plurality of dielectric layers 341-344.

The isolation device 300 may be substantially similar to the isolation device 200 shown in FIG. 2A but differs at least in that the isolation device 300 does not have the neck portion 249 shown in FIG. 2A. Instead, the isolation device 300 may comprise an enhanced isolation layer 349 that may have a substantially uniform thickness. The enhanced isolation layer 349 may have higher isolation capabilities in that the enhanced isolation layer 349 may be substantially thicker than the thickness of each of the isolation layers 341-344. In one embodiment, the enhanced isolation layer 349 may have a thickness that is more than four times the average thickness of the plurality of isolation layers 341-344. In another embodiment, the enhanced isolation layer 349 may have a thickness that is more than five times the average thickness of the plurality of isolation layers 341-344.

In addition to the enhanced thickness discussed above, the enhanced isolation layer 349 may have higher isolation capabilities in that the enhanced isolation layer 349 may comprise material that is highly isolative, or the enhanced isolation layer 349 may be added with highly isolative material. In order to establish electrical contact to the isolation device 300, the topmost metal layer 359 may comprise bond pads having exposed external surfaces 323 and 357. For example, the top plate 322 may have the exposed surface 323 configured to receive an external electrical connection from a first circuit. Similarly, an additional bond pad with the exposed surface 357 may be configured to receive an additional external electrical connection from a second circuit. The isolation device 300 may comprise an elongated via 385 that extends through the enhanced isolation layer 349 so as to establish electrical connection to the plurality of interconnect metal layers 351-354. The topmost metal layer 359 may be reserved for bond pads.

In addition, the isolation device 300 may differ from the previously discussed isolation devices 100 and 200 in that the second plate 325 may be in direct contact with the at least one trench 360. The reason for this difference is that the second plate 325 may be configured to function as an etch stop layer to the at least one trench 360. This optional feature may be applicable to the isolation devices 100 and 200 discussed previously.

The passivation layer 348 of the isolation device 300 may be substantially flat and uniformly cover the top surface of the isolation device 300 other than the exposed surfaces 323 and 357. With this configuration, the isolation device 300 may be less sensitive to moisture since the flat top surface without neck portion may ensure coverage of the passivation layer 348. The thickness of the passivation layer 348 may be substantially uniform.

Figure 4:
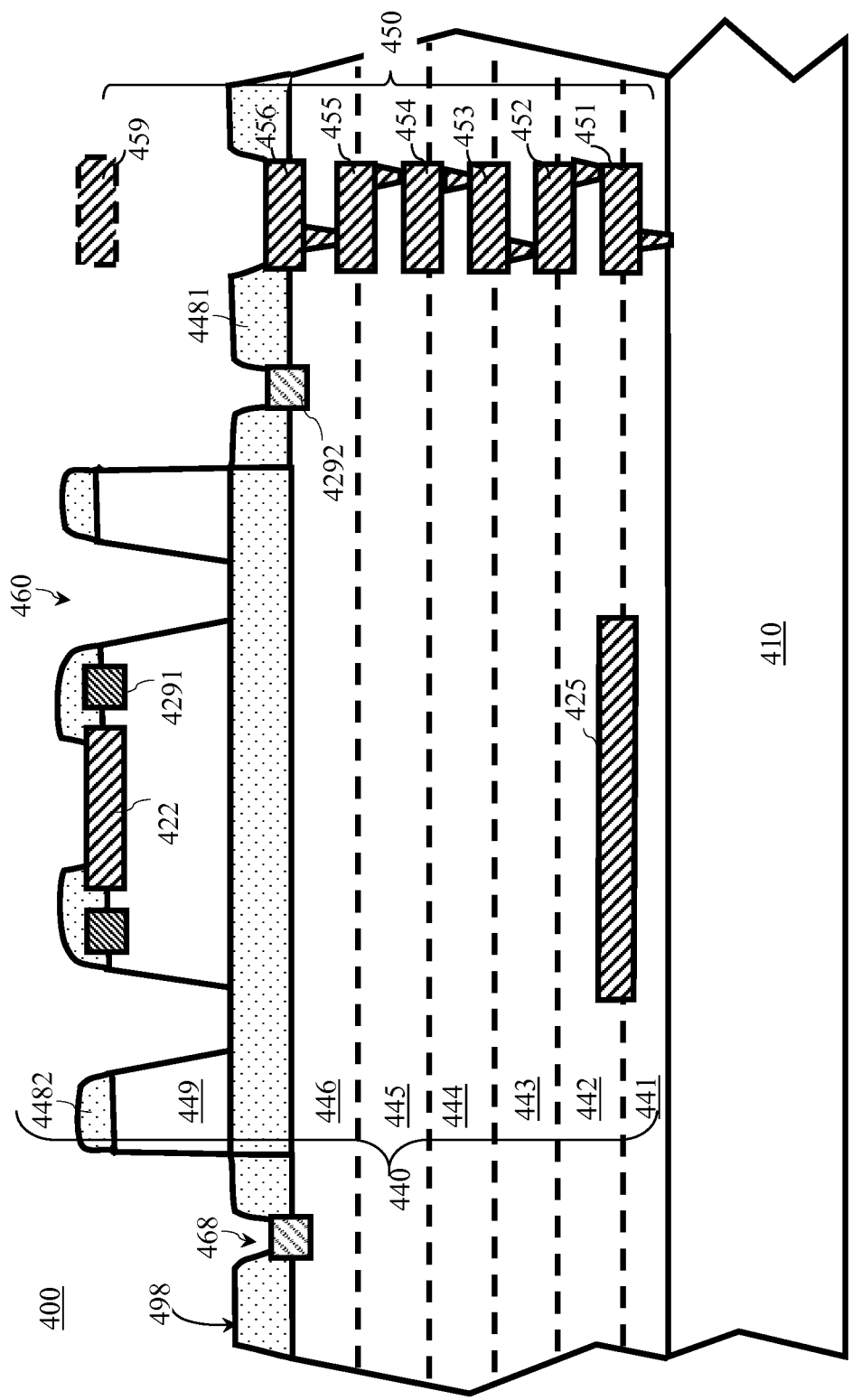
FIG. 4 illustrates a diagrammatic cross sectional view of an isolation device having double passivation layers.

FIG. 4 illustrates a diagrammatic cross sectional view of an isolation device 400. The isolation device 400 may comprise a substrate 410, a first plate 422, a second plate 425, an isolation material 440, at least one trench 460, a plurality of metal layers 450, a first iso-potential ring 4291, a second iso-potential ring 4292, a first passivation layer 4481 and a second passivation layer 4482.

The isolation material 440 may comprise an enhanced isolation layer 449, a plurality of dielectric layers 441-446, the first passivation layer 4481 and the second passivation layer 4482. The enhanced isolation layer 449 may form a neck portion of the isolation device 400 protruding from an upper surface 498.

The plurality of metal layers 450 may comprise a topmost metal layer 459 and a plurality of interconnect metal layers 451-456. In FIG. 4, an illustrative topmost metal layer 459 is drawn on the right hand side of the neck portion 449. The top plate 422 and the first iso-potential ring 4291 may be formed using the topmost metal layer 459.

The isolation device 400 may be substantially similar to the isolation device 200 shown in FIG. 2A but differs at least in the following points.

First, the isolation device 400 may comprise the additional passivation layer 4482 instead of a single passivation layer 248 illustrated in FIG. 2A. The first passivation layer 4481 may cover the plurality of dielectric layers 441-446 and the plurality of interconnect metal layers 451-456, except that surfaces on the topmost interconnect metal layer 456 may be exposed. Consequently, the neck portion of the isolation device 400 may be disposed on the first passivation layer 4481 instead of the dielectric layer 446. Having two passivation layers 4481 and 4482 may be desirable in terms of ease of manufacturing. The neck portion 449 may be un-protected, as the side surfaces are not covered. However, moisture may not sip in further as the neck portion 449 is sitting on the first passivation layer 4481.

Second, the at least one trench 460 of the isolation device 400 may be disposed on the neck portion 449. The at least one trench 460 may stop at the first passivation layer 4481. In this case, a bottom portion of the at least one trench 460 may be in direct contact with the first passivation layer 4481. Alternatively, the at least one trench 460 may intercept at least one dielectric layer 441-446 or all of the plurality of dielectric layers 441-446. In the case that the at least one trench 460 cut through all the dielectric layers 441-446, the at least one trench 460 may be in direct contact with the substrate 410.

Third, the isolation device 400 may comprise one additional trench 468 compared to the isolation device 200 shown in FIG. 2A. While the at least one trench 460 is disposed on the neck portion 449, the additional trench 468 may be defined by the opening of the first passivation layer 4481 on the first surface 498. This may be effective to interrupt residue materials that may occur on the first surface 498 and thus, improve isolation capabilities.

Fourth, the isolation device 400 comprises two iso-potential rings 4291, 4292 instead of one iso-potential ring 229 as shown in FIG. 2A. the two iso-potential rings 4291, 4292 of the isolation device 400 are the first iso-potential ring 4291 disposed on the plane where the first plate 422 is located, and the second iso-potential ring 4292 that is located on a plane disposed planarly between the first plate 422 and the second plate 425. The iso-potential rings 4291, 4292 are substantially parallel to the first plate 422 and the second plate 425. The first iso-potential ring 4291 may surround the first plate 422 on the neck portion 449 of the isolation device 400. The second iso-potential ring 4292 may surround the first plate 422 on the first surface 498 of the isolation device 400 on the plane that is distanced away from the first plate 422. Similar to previously described embodiments, the first plate 422, the second plate 425, the first iso-potential ring 4291 and the second iso-potential ring 4292 may be concentric. While the first iso-potential ring 4291 may be a portion of the topmost metal layer 459, the second iso-potential ring 4292 may be a portion of the topmost interconnect metal layer 456.

Figure 5:
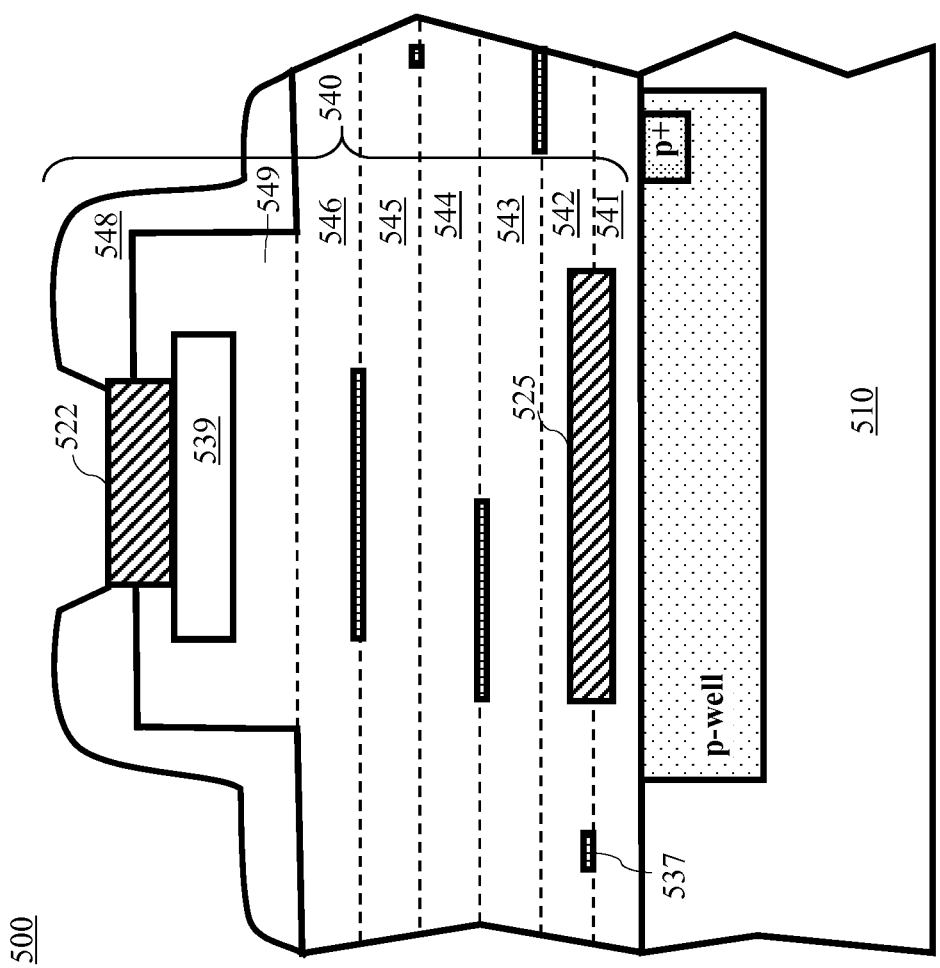
FIG. 5 illustrates a diagrammatic cross sectional view of an isolation device with a high isolative material.

FIG. 5 illustrates a diagrammatic cross sectional view of an isolation device 500. The isolation device 500 may comprise an isolation material 540, a substrate 510, a high isolative material 539, a first plate 522 and a second plate 525. The isolation material 540 may comprise substantially silicone dioxide material. The isolation material 540 may comprise a plurality of isolation layers 541-546, a passivation layer 548, and an enhanced isolation layer 549 similar to the isolation devices 200, 300 and 400 discussed previously. The isolation device 500 may differ from the isolation devices 200, 300 and 400 at least in that the isolation device 500 comprises a layer of high isolative material 539. The highly isolative material 539 may be made from a material that provides higher isolation compared to the isolation material 540. One example of the highly isolative material 539 may be polyimide.

In the embodiment shown in FIG. 5, the high isolative material 539 may be embedded within the enhanced isolation layer 549 such that the highly isolative material 539 may be sandwiched between the first plate 522 and the topmost isolation layer 546 In other embodiments, the high isolative material 539 may be sandwiched between two of the plurality of isolation layers 541-546 or between the topmost isolation layer 546 and the enhanced isolation layer 549. The high isolative material 539 may be in direct contact with one of the first plate 522 and the second plate 525.

In yet another embodiment, the highly isolative material 539 may be disposed between the plurality of isolation layers 541-546 between the first plate 522 and the second plate 525. The highly isolative material 539 may be configured to cover any potential residue material 537 that may exist between the first plate 522 and the second plate 525 so as to break any potential breakdown path as illustrated in FIG. 2E.

Figure 6A:
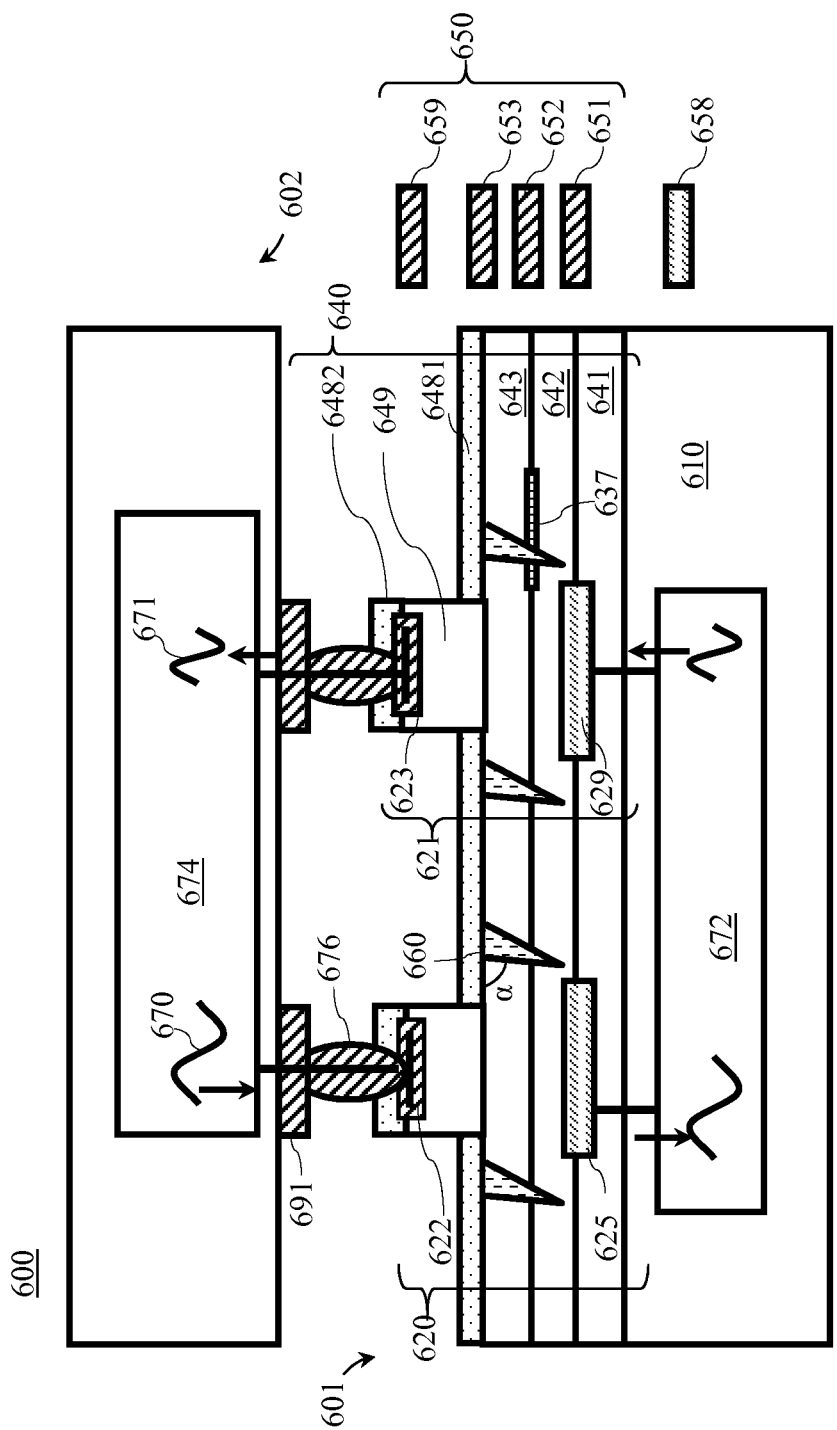
FIG. 6A illustrates a diagrammatic view of a first isolation system with two semiconductor dies.

FIG. 6A illustrates a diagrammatic view of an isolation system 600. The isolation system 600 may comprise a primary die 601, a first circuit 672, an additional die 602, and a second circuit 674. The terminology "primary" as referred to the primary die 601 is by no means indicating importance of the die relative to other dies or other components. The terminology "primary" merely distinguishes the two dies 601, 602. The terminology "primary" is chosen for the primary die 601 because majority of the elements recited here are disposed on the primary die 601.

The primary die 601 may comprise a topmost metal layer 659, a plurality of additional metal layers 651-653, a substrate 610, a coupling device 620, and an isolation material 640. The substrate 610 may be a semiconductor substrate 610 that integrated circuits are formed on. The isolation material 640 may comprise an enhanced isolation layer 649, a first passivation layer 6481, a second passivation layer 6482, and a plurality of isolation layers 641-643. The isolation layers 641-643 may also be referred as dielectric layers. The plurality of isolation layers 641-643 comprises a topmost dielectric layer 643. The topmost dielectric layer 643 may be positioned furthest from the semiconductor substrate 610.

The plurality of additional metal layers 651-653 may be interconnect-metal layers. For example, the plurality of additional metal layers 651-653 may comprise a topmost interconnect metal layer 653, and a first interconnect metal layer 651, and a second interconnect metal layer 652. The plurality of metal layers 651-653 may be electrically interconnected through "vias." However, the plurality of additional metal layers 651-653 may be electrically isolated from the topmost metal layer 659.

A surface of the topmost interconnect metal layer 653 may be exposed so as to receive a wire bond or a solder ball to establish electrical connections externally. Similarly, a surface of the topmost metal layer 659 may be exposed so as to receive a wire bond or a solder ball 676 to establish electrical connections externally.

The coupling device 620 may be disposed within the primary die 601. The coupling device 620 may comprise a first plate 622 and a second plate 625. The first plate 622 of the coupling device 620 may be formed by a portion of the topmost metal layer 659. The first plate 622 may be electrically connected to the second circuit 674 resided in the additional die 602. The second plate 625 may be electrically connected to the first circuit 672 that reside in the primary die 601.

The second plate 625 of the coupling device 620 may be formed by a conductive layer 658 of the primary die 601. The conductive layer 658 may be one of the additional metal layers 651-653, a sub-layer within the substrate 610 that has been made highly conductive such as active layer, polysilicon layer or a highly doped well layer, or any other layer within the substrate 610 that is substantially more electrically conductive relative to the substrate 610.

In one embodiment, the conductive layer 658 that forms the second plate 625 may be closest to the substrate 610 such that the plurality of additional metal layers 651-653 may be sandwiched between the conductive layer 658 and the topmost metal layer 659. For example, the conductive layer 658 may be a poly-silicon layer deposited on the substrate 610.

A portion of the isolation material 640 may be sandwiched between the first plate 622 and the second plate 625. The isolation material 640 may be surrounding the plurality of additional metal layers 651-653. Each of the plurality of additional isolation layers 641-643 may be sandwiched between two layers selected from the additional metal layer 651-653 and the substrate 610. The additional isolation layer 641-643 may be referred as dielectric layers 651-653. The enhanced isolation layer 649 maybe in direct contact with the topmost metal layer 659. The plurality of additional isolation layer 641-643 may be arranged such that the enhanced isolation layer 649 is sandwiched between the plurality of additional isolation layers 641-643 and the topmost metal layer 659.

The enhanced isolation layer 649 may be functionally thicker than the plurality of additional isolation layers 641-643. While each of the plurality of additional isolation layers 641-643 has a thickness that is sufficient to separate the plurality of metal layers 651-653 to minimise capacitive coupling noise, the enhanced isolation layer 649 may have a relatively higher thickness that is capable of withstanding high voltage difference across the first plate 622 and the second plate 625 compared to each of the plurality of additional isolation layers 641-643 may not withstand. For example, each of the plurality of additional isolation layers 641-643 may breakdown at a breakdown voltage, Vbreakdown, the voltage difference across the enhanced isolation layer 649 may be at least five times Vbreakdown. In the embodiment shown in FIG. 6, the enhanced isolation layer 649 may be sandwiched between the first plate 622 and the semiconductor substrate 610. The enhanced isolation layer 649 may form a neck portion 649. The neck portion 649 may protrude out from the semiconductor substrate 610.

As explained in previous embodiments, unwanted and undesirable residue materials 637 may be formed between the isolation material 640 when the primary die 601 is fabricated. The residue materials 637 may be sandwiched between any two layers from the enhanced isolation layer 649 and the plurality of additional isolation layers 641-643. Generally, the residue materials 637 may be accumulated planarly parallel to the substrate 610 and one of the additional isolation layers 641-643. The residue materials 637 may be metal traces or deposition of conductive material that appears in microscopic amount.

As the residue materials 637 may be electrically conductive, the residue materials 637 may be substantially highly conductive relative to the isolation materials 640. The residue materials 637 may comprise microscopic metallic traces that are not electrically connected to the plurality of the additional metal layers 651-653. The residue materials 637 may comprise electrically conductive material that attracts electrical flux generated from the first plate 622.

The semiconductor substrate 610 may be covered by the first passivation layer 6481. The first passivation layer 6481 may be covering the plurality of additional metal layers 651-653, the plurality of isolation layers 641-643, and the trench 660. This is to prevent moisture from sipping in to the plurality of metal layers 640 and other internal layers other than exposed surface that are meant for receiving external electrical connections.

The isolation system 600 may further comprise a solder ball 676. The primary die 601 and the additional die 602 may be positioned facing each other such that the solder ball 676 may be sandwiched between the primary die 601 and the additional die 602. The solder ball 676 may be in direct contact with the first plate 622 of the coupling device 620 of the primary die 601. The additional die 602 may comprise a metal pad 691. The solder ball 676 may be in direct contact with the metal pad 691.

The first circuit 672 may be integrated substantially in the primary die 601. The second circuit 674 may be integrated substantially in the additional die 602. However, in other embodiment, the first circuit 672 may be integrated in the primary die 601, as well as other additional dies (not shown). Similarly, the second circuit 674 may be integrated substantially in more than one die 602.

An additional coupling device 621 may be disposed within the primary die 601. The additional coupling device 621 may have an additional first plate 623 and an additional second plate 629. The additional first plate 623 may be a portion of the topmost metal layer 659 and the additional second plate 629 may be a portion of the conductive layer 658. The additional first plate 623 may be electrically coupled to the second circuit 674. The additional second plate 629 may be electrically connected to the first circuit 672.

In the embodiment shown in FIG. 6, a first coupling device 620 is configured to transmit a signal 670 from the second circuit 674 in the additional die 602 to the first circuit 672 resided in the primary die 601. The second coupling device 621, on the other hand, is configured to transmit a return signal 671 from the first circuit 672 in the primary die 601 to the second circuit 674 resided in the additional die 602. Optionally, the coupling device 620 and the additional coupling device 621 may be configured to transmit a differential signal between the first circuit 672 and the second circuit 674.

The isolation system 600 may further comprise a trench 660. The trench 660 may be circumscribing at least one of the first plate 622 and the second plate 625 intersecting the semiconductor substrate 610 as shown in previous embodiments. The trench 660 may intersect the semiconductor substrate 610 at an angle α between 60 degrees and 120 degrees relative to the semiconductor substrate 610. The trench 660 may have a pointed end. In the example shown in FIG. 6A, the primary die 601 may comprise a plurality of dielectric layers 641-643. The plurality of dielectric layers 641-643 may have a topmost dielectric layer 643. The topmost dielectric layer 643 may be positioned furthest from the semiconductor substrate 610. The trench 660 may be covered by the topmost dielectric layer 643.

Figure 6B:
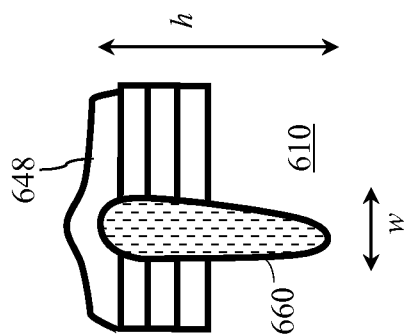
FIGS. 6B-6D illustrate diagrammatic views of a trench filled with isolation materials.
Figure 6C:
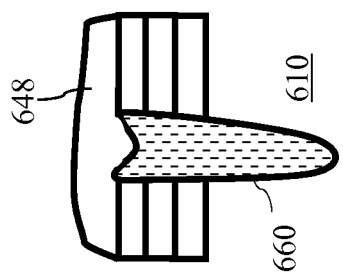
Figure 6D:
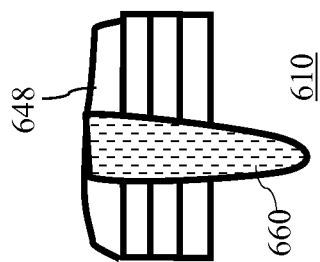

The trench 660 may be filled with an additional isolation material, and subsequently the trench 660 may be covered by the first passivation layer 4481. FIGS. 6B-6C illustrate a diagrammatic view of the trench 660 filled with isolation materials. Referring to FIG. 6B, the additional isolation material may overfill the trench 660 such that the additional isolation material may form a bump portion. The first passivation layer 648 may cover the bump portion of the additional isolation material.

Referring to FIG. 6A and FIG. 6B, the semiconductor substrate 610 may extend planarly on a horizontal plane. The trench 660 may have a height dimension h that may extend substantially perpendicularly relative to the horizontal plane. The trench 660 may have a width dimension w that is at least two microns but less than twenty microns. In one embodiment, the width dimension w may be at least five microns. As shown in FIG. 6B, the trench 660 may have a tapering end towards the substrate in the vertical direction. In addition, as shown in FIG. 6B, the trench 660 may have a rounded end.

The trench 660 may be under filled as shown in FIG. 6C. Optionally, the trench 660 may be formed after the passivation layer 6481 is formed as shown in the embodiment illustrated in FIG. 6D. In this case, the trench 660 may be made by using ultra-sound drilling.

Figure 7:
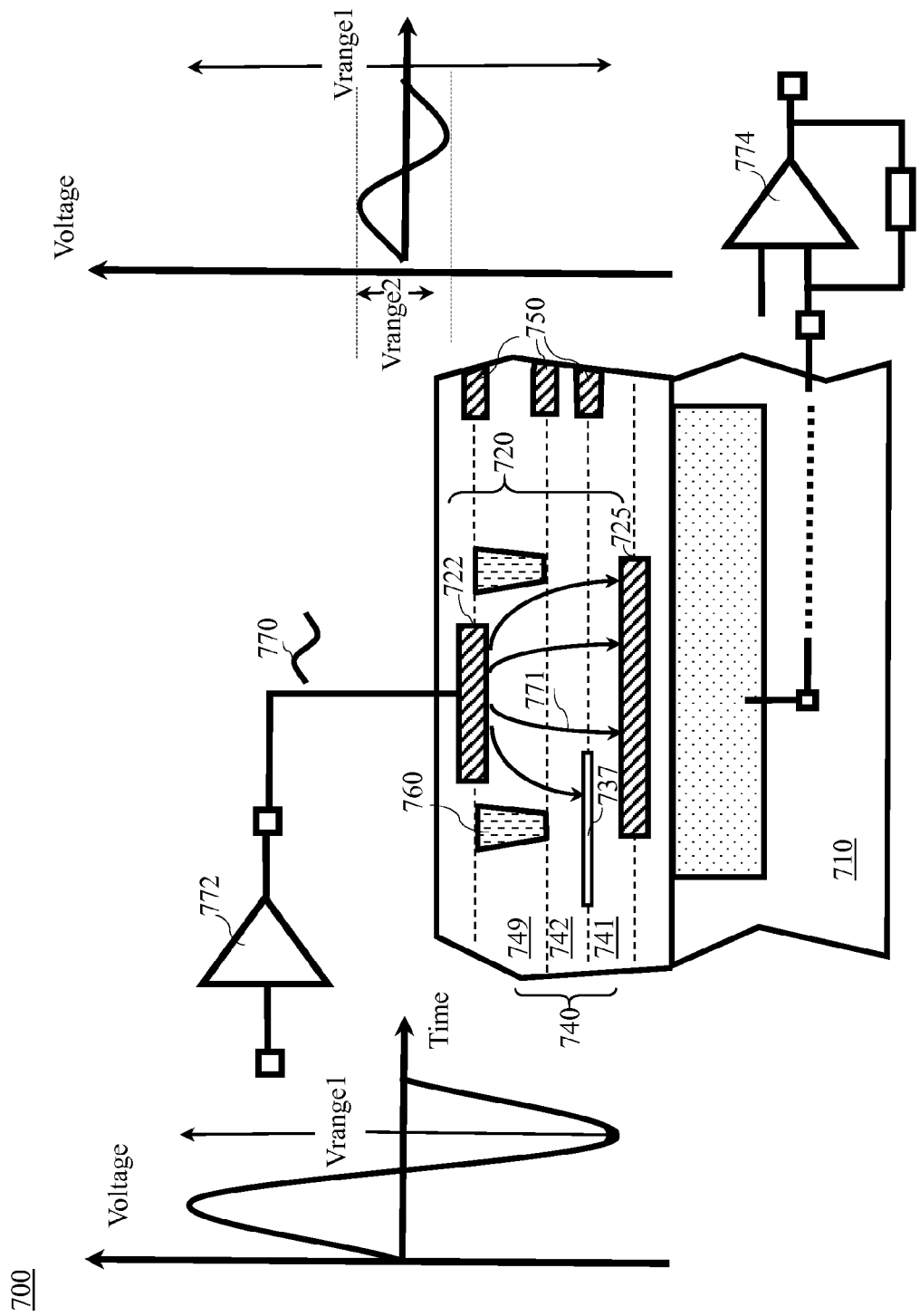
FIG. 7 illustrates a diagrammatic cross sectional view of a second isolation system with circuits operating in different voltage ranges.

FIG. 7 illustrates a diagrammatic cross sectional view of an isolation system 700 operating in different voltage ranges. The isolation system 700 may comprise a first circuit 772, a second circuit 774, and a capacitive isolator 720. The first circuit 772 may be operating at a first voltage range Vrange1. The second circuit 774 may be operating at a second voltage range Vrange2 that is different from the first voltage range Vrange1. For example, the first voltage range Vrange1 may be between plus minus thirty volts and the second voltage range Vrange2 may be between plus minus five volts. The second circuit 774 may comprise one or more metal layers 750 established on a substrate 710. The substrate 710 may be a semiconductor substrate 710.

The capacitive isolator 720 may electrically isolate the first circuit 772 from the second circuit 774 while enabling control signals 770 to pass between the first circuit 772 and second circuit 774 in electrical flux 771. The capacitive isolator 720 may comprise a first capacitive element 722, a second capacitive element 725, an isolation material 740, and at least one trench 760. In one example, the isolation material 740 maybe a dielectric material 740 covering the semiconductor substrate 710.

The first capacitive element 722 may be in electrical communication with the first circuit 772 and may be disposed adjacent to the one or more metal layers 750. The second capacitive element 725 may be positioned in an overlapping arrangement with the first capacitive element 722. The second capacitive element 725 may be in electrical communication with the one or more metal layers 750 of the second circuit 774.

The isolation material 740 may be positioned between the first capacitive element 722 and the second capacitive element 725. The isolation material 740 may substantially prevent current from flowing directly between the first capacitive element 722 and the second capacitive element 725, but enables electrical flux 771 to pass between the first capacitive element 722 and the second capacitive element 725.

The isolation material 740 may comprise an enhanced isolation layer 749, residue materials 737, at least one additional isolation layer such as a first isolation layer 741, and a second isolation layer742 that may be formed between the isolation material 740. The enhanced isolation layer 749 may be in direct contact with one of the first capacitive element 722 and the second capacitive element 725. The at least one additional isolation layer 741-742 may be disposed adjacent to the other one of the first capacitive element 722 and the second capacitive element 725. The residue materials 737 may be disposed between the enhanced isolation layer 749 and the at least one additional isolation layer 741, 742.

The at least one trench 760 may be planarly surrounding at least one of the first capacitive element 722 and the second capacitive element 725. For example, the at least one trench 760 may form a close loop on a first plane that is parallel to the substrate 710 surrounding one of the first capacitive element 722 and the second capacitive element 725. The first plane may be located on a plane where one of the first or second capacitive elements 722 and 725 is located on, or alternatively, the first plane may be located between the first capacitive element 722 and second capacitive element 725 as illustrated in previous embodiments. The at least one trench 760 may extend through the dielectric material 740.

Figure 8:
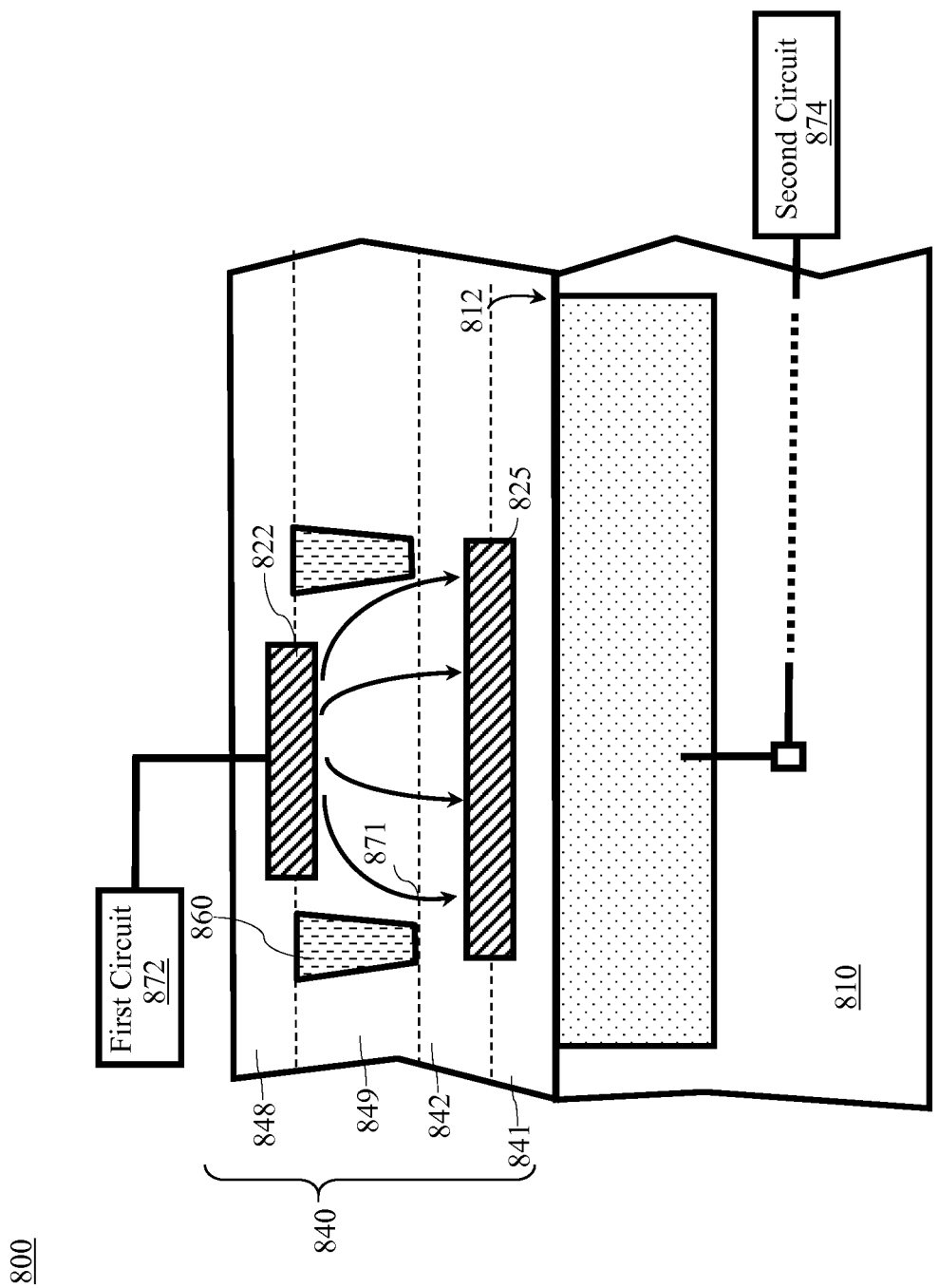
FIG. 8 illustrates a diagrammatic cross sectional view of an isolation capacitor with at least one trench.

FIG. 8 illustrates a diagrammatic cross sectional view of an isolation capacitor 800. The isolation capacitor 800 may comprise a first capacitive element 822, a second capacitive element 825, a semiconductor substrate 810, an isolation material 840, and at least one trench 860.

The first capacitive element 822 may be in electrical communication with a first circuit 872. The second capacitive element 825 may be in electrical communication with a second circuit 874. The second circuit 874 may be electrically separated from the first circuit 872 for various reasons. For example, each of the first circuit 872 and the second circuit 874 may need to be operated at different voltages. In another example, the first circuit 872 and the second circuit 874 may draw power from different transformers located on different devices that are physically separated. In yet another example, one of the first circuit 872 and the second circuit 874 may be susceptible to noisy environment and need to be electrically isolated.

The first capacitive element 822 and the second capacitive element 825 may be established on the semiconductor substrate 810. The isolation material 840 may be covering a top surface 812 of the semiconductor substrate 810. At least one of the first capacitive element 822 and the second capacitive element 825 may be buried within the isolation material 840.

The isolation material 840 may comprise a passivation layer 848, and a plurality of isolation layers 841, 842 and 849. The plurality of isolation layers 841, 842 and 849 may be positioned between the first capacitive element 822 and the second capacitive element 825. The plurality of isolation layers 841, 842, and 849 may substantially prohibit electrical current from flowing between the first capacitive element 822 and second capacitive element 825, thereby maintaining an electrical isolation between the first circuit 872 and second circuit 874. The plurality of isolation layers 841, 842, and 849 may allow a capacitively coupled signal 871 to travel between the first capacitive element 822 and second capacitive element 825 thereby enabling communication between the first circuit 872 and second circuit 874 even though the first circuit 872 and second circuit 874 are electrically isolated from one another.

The plurality of isolation layers 841, 842, 849 may comprise a first layer 849 that is thicker than any other layers of the plurality of isolation layers 841 and 842. For example, the first layer 849 may have enhanced isolation capabilities through having a substantially thicker layer. Alternatively, the first layer 849 may be made from a material that has a high breakdown voltage.

The at least one trench 860 may be circulating at least one of the first capacitive element 822 and the second capacitive element 825. The at least one trench 860 may be circulating both the first capacitive element 822 and the second capacitive element 825 on a plane that is parallel to one of the first capacitive element 822 and the second capacitive element 825. The at least one trench 860 may be extending through the isolation material 840 on a horizontal plane.

Figure 9:
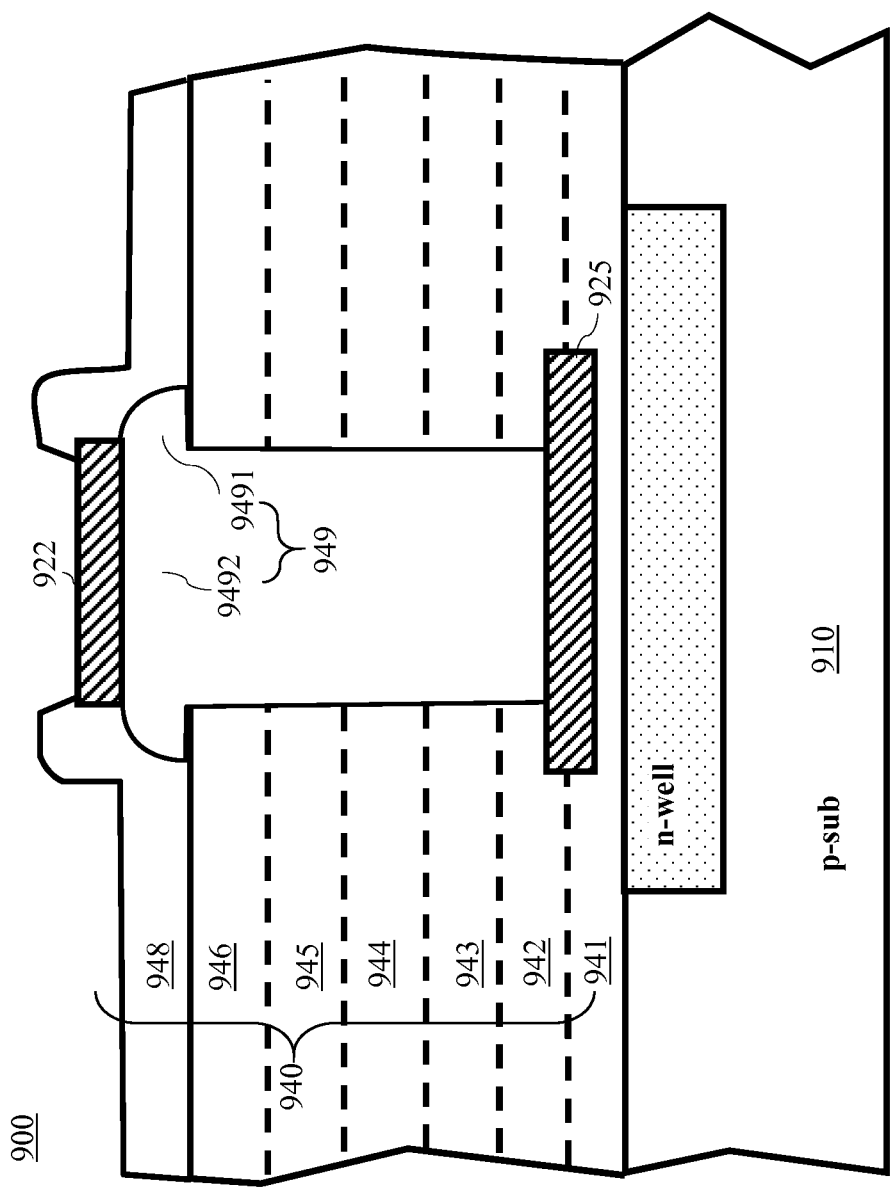
FIG. 9 illustrates a diagrammatic cross sectional view of an isolation capacitor with an isolation material with a thick portion.

FIG. 9 illustrates a diagrammatic cross sectional view of an isolation capacitor 900 having an embedded enhanced isolation layer 949. The isolation capacitor 900 may comprise a first capacitive element 922, a second capacitive element 925, a semiconductor substrate 910, and an isolation material 940. The isolation capacitor 900 may be substantially similar to the isolation device 200 and the isolation capacitor 800 but differs in that the isolation capacitor 900 comprises the embedded enhanced isolation layer 949. The embedded enhanced isolation layer 949 may be a single integrated portion of a material embedded and surrounded by the isolation material 940. The embedded enhanced isolation layer 949 may have similar characteristics to the enhanced isolation material 249 illustrated in FIG. 2A in that the embedded enhanced isolation layer 949 may have a thickness dimension that is at least 3 times to 5 times thicker than any other isolation layers 941-946 of the isolation material 940. In addition, the embedded enhanced isolation layer 949 may be made from a material that is more tolerant towards high voltage.

Figure 10:
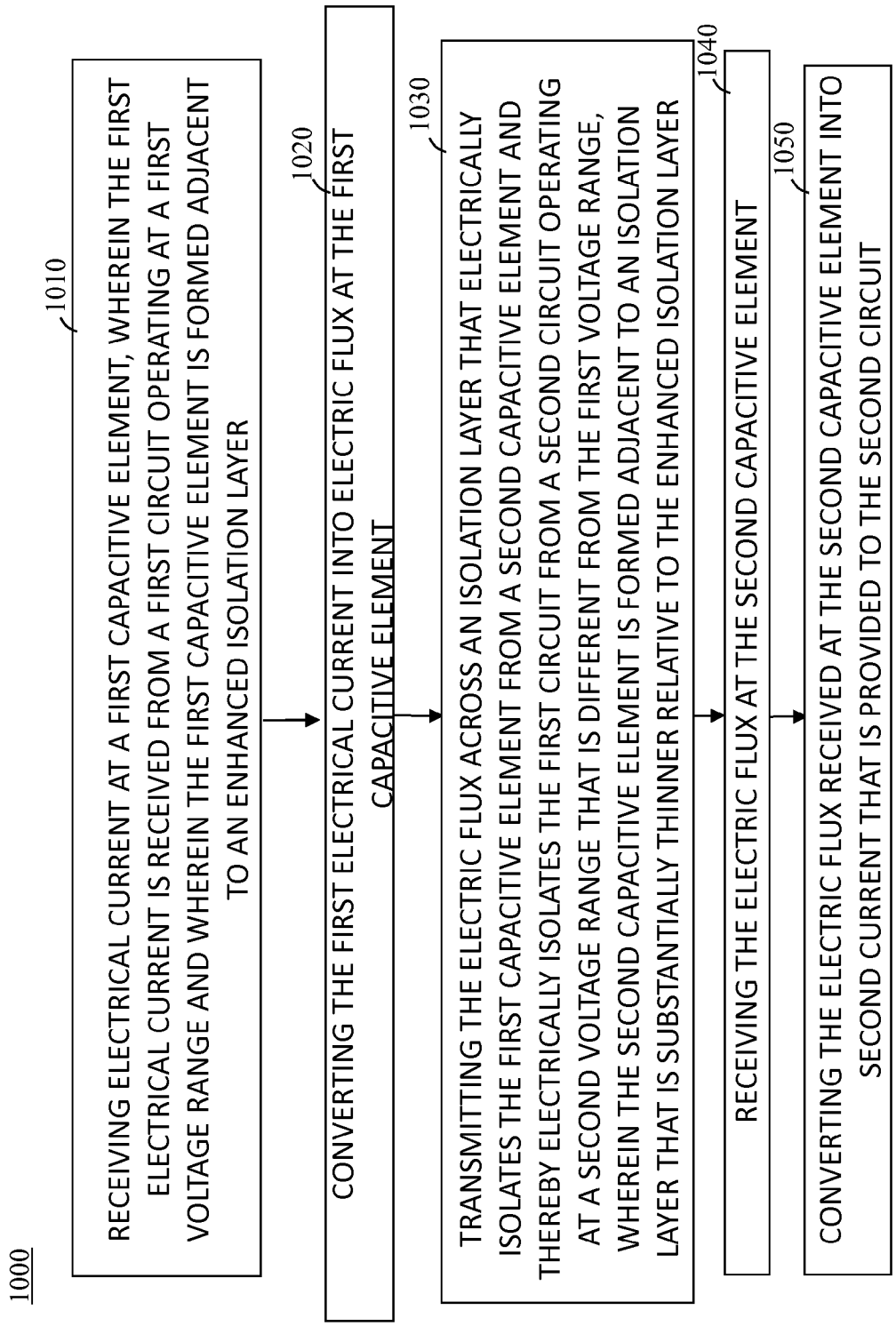
FIG. 10 illustrates a flow chart showing a first method of operating a capacitive isolator with an enhanced isolation layer.

FIG. 10 illustrates a flow chart showing a method of operating a capacitive isolator. The method may begin by receiving electrical current at a first capacitive element as shown in Step 1010. The first electrical current may be received from a first circuit operating at a first voltage range. The first capacitive element may be disposed adjacent to an enhanced isolation layer. In Step 1020, the first electrical current may be converted into electric flux at the first capacitive element. In Step 1030, the electric flux may be transmitted across an isolation layer. The isolation layer electrically isolates the first capacitive element from a second capacitive element and thereby electrically isolates the first circuit from a second circuit. The second circuit may be operating at a second voltage range that is different from the first voltage range. The second capacitive element may be disposed adjacent to an isolation layer that is thinner relative to the enhanced isolation layer. In Step 1040, the electric flux may be received at the second capacitive element. In Step 1050, the electric flux received at the second capacitive element may be converted into second current that is provided to the second circuit.

Figure 11:
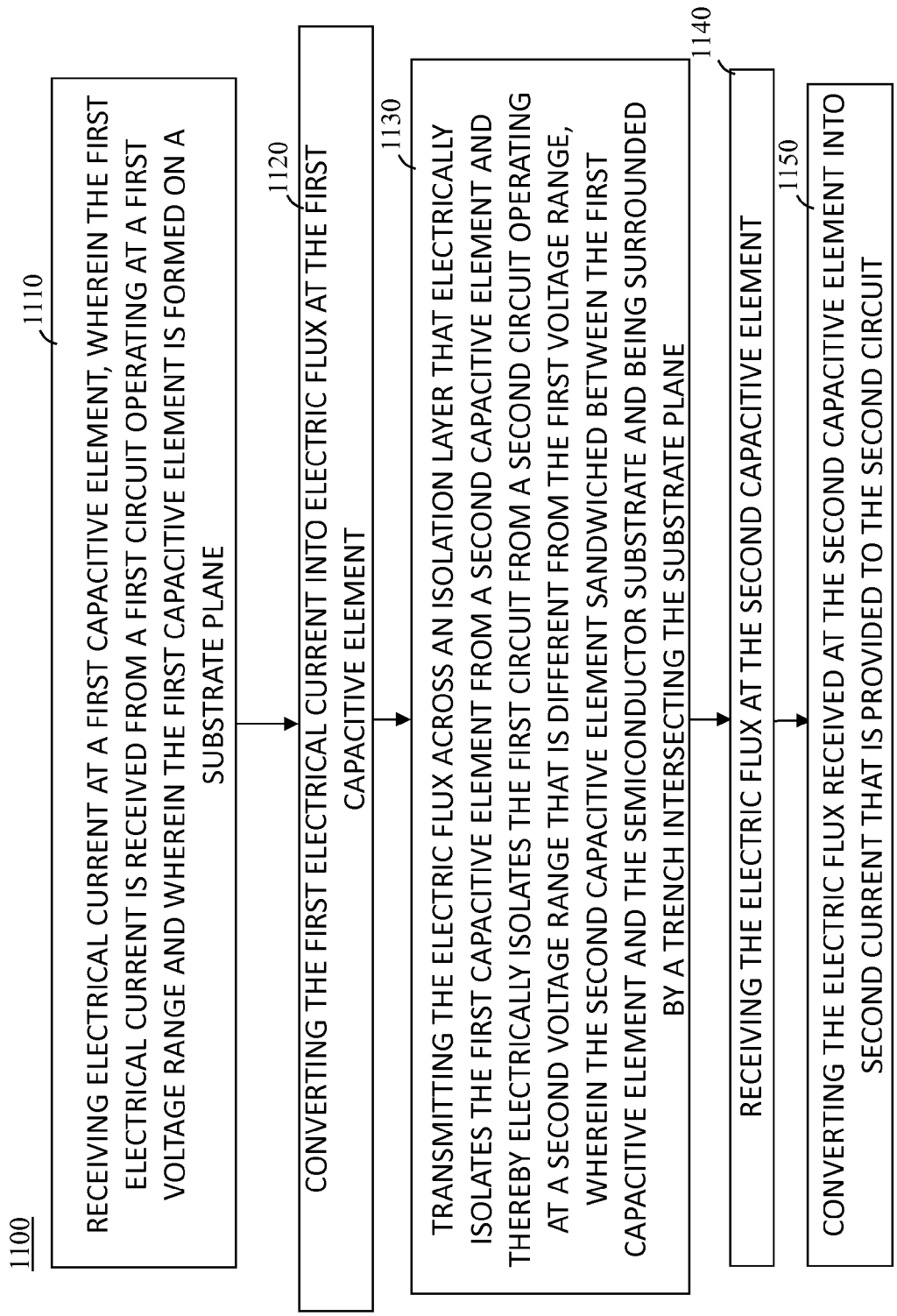
FIG. 11 illustrates a flow chart showing a method of operating a capacitive isolator with a trench.

FIG. 11 illustrates a flow chart showing a method of operating a capacitive isolator with a trench. The method may begin by receiving electrical current at a first capacitive element as shown in Step 1110. The first electrical current may be received from a first circuit operating at a first voltage range. The first capacitive element may be formed on a substrate plane. In Step 1120, the first electrical current may be converted into electric flux at the first capacitive element. In Step 1130, the electric flux may be transmitted across an isolation layer. The isolation layer electrically isolates the first capacitive element from a second capacitive element and thereby electrically isolates the first circuit from a second circuit. The second circuit may be operating at a second voltage range that is different from the first voltage range. The second capacitive element may be sandwiched between the first capacitive element and the semiconductor substrate and being surrounded by a trench intersecting the substrate plane. In Step 1140, the electric flux may be received at the second capacitive element. In Step 1150, the electric flux received at the second capacitive element may be converted into second current that is provided to the second circuit.

Different aspects, embodiments or implementations may, but need not, yield one or more of the following advantages. For example, the enhanced isolation layer and the at least one trench discussed in various embodiments may improve isolation capability. This may contributes towards higher breakdown of the isolation device.

Although specific embodiments of the invention have been described and illustrated herein above, the invention should not be limited to any specific forms or arrangements of parts so described and illustrated, but should also taking into consideration any combination of features illustrated in the same embodiment, or in other embodiments. For example, various alternative implementations of the at least one trench and the enhanced isolation layer may be combined in any other embodiments. The isolation system 600 and the isolation system 700 may employ the isolation devices 100, 200, 300, and 400 although not specifically disclosed above. Similarly, the isolation capacitor 800 and the isolation capacitor 900 may employ the enhanced isolation layer and the at least one trench discussed in the isolation devices 100, 200, 300, and 400. The scope of the invention is to be defined by the claims appended hereto and their equivalents.

What is claimed is:

1. An isolation device that isolates a first electrical signal of a first circuit from reaching a second circuit, comprising:
   a substrate having a first surface;
   a first plate electrically coupled to the first circuit;
   a second plate electrically coupled to the second circuit, wherein the first plate and the second plate are positioned in parallel to each other;
   an isolation material sandwiched between the first plate and the second plate, the isolation material allowing a coupling signal to travel between the first plate and the second plate enabling communication between the first circuit and the second circuit even though the first circuit and second circuit are electrically isolated from one another; and
   at least one trench extending at least partially through the isolation material in a direction substantially perpendicular to the first surface, wherein the at least one trench is positioned adjacent to the first plate and the second plate,
   wherein the at least one trench encircles at least one of the first plate and the second plate.

2. The isolation device of claim 1, wherein the at least one trench circumscribes at least one of the first plate and the second plate such that the at least one trench forms a closed loop geometrical figure surrounding the at least one of the first plate and the second plate.

3. The isolation device of claim 1, wherein the second plate extends substantially planarly on a first plane, and wherein the at least one trench encircles the second plate on the first plane.

4. The isolation device of claim 1, wherein the at least one trench encircles the second plate on a second plane, wherein the second plane is substantially planarly distanced away from the second plate.

5. The isolation device of claim 2, wherein the at least one trench is coaxially aligned to at least one of the first plate and the second plate.

6. The isolation device of claim 1, wherein the first plate extends substantially planarly on a first plane, the second plate extends on a second plane that is substantially parallel to the first plane, and the at least one trench circumscribes the first plate and the second plate on a third plane that is distanced away but substantially parallel to the first plate.

7. An isolation device that isolates a first electrical signal of a first circuit from reaching a second circuit, comprising:
   a substrate having a first surface;
   a first plate electrically coupled to the first circuit;

a second plate electrically coupled to the second circuit, wherein the first plate and the second plate are positioned in parallel to each other;

an isolation material sandwiched between the first plate and the second plate, the isolation material allowing a coupling signal to travel between the first plate and the second plate enabling communication between the first circuit and the second circuit even though the first circuit and second circuit are electrically isolated from one another; and at least one trench extending at least partially through the isolation material in a direction substantially perpendicular to the first surface, wherein the at least one trench is positioned adjacent to the first plate and the second plate, wherein the at least one trench comprises a plurality of trench members surrounding at least one of the first plate and the second plate, wherein each of the plurality of trench members comprises a curvature segment, and wherein the curvature segment of each of the plurality of trench members extend axially from a curvature center that is located on at least one of the first plate and the second plate.

8. The isolation device of claim 1, wherein the at least one trench comprises a plurality of trench members surrounding at least one of the first plate and the second plate, and wherein each of the plurality of trench members comprises a linear trench segment.

9. The isolation device of claim 1, wherein the at least one trench comprises a plurality of trench members surrounding at least one of the first plate and the second plate, wherein each of the plurality of trench members comprises a curvature segment, and wherein the curvature segment of each of the plurality of trench members extend axially from a curvature center that is located on at least one of the first plate and the second plate.

10. The isolation device of claim 1, wherein the at least one trench comprises a plurality of trench members surrounding at least one of the first plate and the second plate, and wherein each of the plurality of trench members has substantially same size and shape.

11. The isolation device of claim 1, wherein the at least one trench comprises a plurality of trench members surrounding at least one of the first plate and the second plate, and wherein the at least one trench further comprises a plurality of additional trench members surrounding the plurality of trench members.

12. The isolation device of claim 11, wherein the plurality of trench members and the plurality of additional trench members are arranged such that a cross sectional view taken along a plane substantially perpendicular to the first surface extending through the first plate intersects at least two cross-sectional trenches and sandwiching thereby, at least one of the first plate and the second plate.

13. An isolation device that isolates a first electrical signal of a first circuit from reaching a second circuit, comprising:
a substrate having a first surface;
a first plate electrically coupled to the first circuit;
a second plate electrically coupled to the second circuit, wherein the first plate and the second plate are positioned in parallel to each other;
an isolation material sandwiched between the first plate and the second plate, the isolation material allowing a coupling signal to travel between the first plate and the second plate enabling communication between the first circuit and the second circuit even though the first circuit and second circuit are electrically isolated from one another;
at least one trench extending at least partially through the isolation material in a direction substantially perpendicular to the first surface, wherein the at least one trench is positioned adjacent to the first plate and the second plate; and
an etch stop layer connected to a bottom portion of the at least one trench.

14. The isolation device of claim 1, further comprising a passivation layer substantially covering the isolation material.

15. The isolation device of claim 14, wherein the at least one trench extends through the passivation layer.

16. The isolation device of claim 14, wherein the passivation layer substantially covers an inner portion of the at least one trench.

17. An isolation device that isolates a first electrical signal of a first circuit from reaching a second circuit, comprising:
a substrate having a first surface;
a first plate electrically coupled to the first circuit;
a second plate electrically coupled to the second circuit, wherein the first plate and the second plate are positioned in parallel to each other;
an isolation material sandwiched between the first plate and the second plate, the isolation material allowing a coupling signal to travel between the first plate and the second plate enabling communication between the first circuit and the second circuit even though the first circuit and second circuit are electrically isolated from one another;
at least one trench extending at least partially through the isolation material in a direction substantially perpendicular to the first surface, wherein the at least one trench is positioned adjacent to the first plate and the second plate; and
a passivation layer substantially covering the isolation material, wherein the at least one trench is filled using a dielectric material.

18. The isolation device of claim 17, wherein the passivation layer covers the dielectric material.

19. The isolation device of claim 1, wherein the first plate and the second plate are arranged substantially parallel to a first external surface of the isolation device, and wherein the at least one trench extends into the first external surface.

20. The isolation device of claim 1, wherein the isolation material comprises a plurality of dielectric layers and a plurality of interconnect metal layers, and each of the plurality of dielectric layers is sandwiched between two of the plurality of interconnect metal layers, and wherein the at least one trench extends through at least two layers of the plurality of dielectric layers.

21. The isolation device of claim 20, wherein the isolation material comprises at least one portion of residue material between two of the plurality of dielectric layers, and the at least one trench divides the at least one portion of residue material into two electrically isolated portions.

22. The isolation device of claim 1, wherein the at least one trench has a width of at least five microns.

23. The isolation device of claim 1, wherein the at least one trench has a width that is less than twenty microns.

24. The isolation device of claim 17, wherein the at least one trench circumscribes at least one of the first plate and the second plate such that the at least one trench forms a closed loop geometrical figure surrounding the at least one of the first plate and the second plate.

25. The isolation device of claim 17, wherein the at least one trench encircles at least one of the first plate and the second plate.

26. The isolation device of claim 25, wherein the second plate extends substantially planarly on a first plane, and wherein the at least one trench encircles the second plate on the first plane.

27. The isolation device of claim 25, wherein the at least one trench encircles the second plate on a second plane, wherein the second plane is substantially planarly distanced away from the second plate.

28. The isolation device of claim 24, wherein the at least one trench is coaxially aligned to at least one of the first plate and the second plate.

29. The isolation device of claim 17, wherein the first plate extends substantially planarly on a first plane, the second plate extends on a second plane that is substantially parallel to the first plane, and the at least one trench circumscribes the first plate and the second plate on a third plane that is distanced away but substantially parallel to the first plate.

30. The isolation device of claim 17, wherein the at least one trench comprises a plurality of trench members surrounding at least one of the first plate and the second plate, and wherein each of the plurality of trench members comprises a linear trench segment.

31. The isolation device of claim 17, wherein the at least one trench comprises a plurality of trench members surrounding at least one of the first plate and the second plate, wherein each of the plurality of trench members comprises a curvature segment, and wherein the curvature segment of each of the plurality of trench members extend axially from a curvature center that is located on at least one of the first plate and the second plate.

32. The isolation device of claim 17, wherein the at least one trench comprises a plurality of trench members surrounding at least one of the first plate and the second plate, and wherein each of the plurality of trench members has a substantially same size and shape.

33. The isolation device of claim 17, wherein the at least one trench comprises a plurality of trench members surrounding at least one of the first plate and the second plate, and wherein the at least one trench further comprises a plurality of additional trench members surrounding the plurality of trench members.

34. The isolation device of claim 33, wherein the plurality of trench members and the plurality of additional trench members are arranged such that a cross sectional view taken along a plane substantially perpendicular to the first surface extending through the first plate intersects at least two cross-sectional trenches and sandwiching thereby, at least one of the first plate and the second plate.

* * * * *